US012751056B2

(12) United States Patent
Yang et al.

(10) Patent No.: US 12,751,056 B2
(45) Date of Patent: Sep. 29, 2026

(54) SEMICONDUCTOR SOURCE/DRAIN REGIONS COMPRISING MULTI-LAYERS WITH DIFFERENT DOPANT CONCENTRATIONS AND METHODS OF FORMING THE SAME

(71) Applicant: Taiwan Semiconductor Manufacturing Co., Ltd., Hsinchu (TW)

(72) Inventors: Yung-Chun Yang, New Taipei City (TW); Wei Hao Lu, Taoyuan City (TW); Wei-Min Liu, Hsinchu (TW); Li-Li Su, Chubei City (TW); Chii-Horng Li, Zhubei City (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 667 days.

(21) Appl. No.: 17/712,965

(22) Filed: Apr. 4, 2022

(65) Prior Publication Data

US 2023/0317785 A1 Oct. 5, 2023

(51) Int. Cl.
*H10D 62/10* (2025.01)
*H10D 30/01* (2025.01)
(Continued)

(52) U.S. Cl.
CPC ......... *H10D 62/118* (2025.01); *H10D 30/031* (2025.01); *H10D 30/6713* (2025.01);
(Continued)

(58) Field of Classification Search
CPC ......... H01L 29/0665; H01L 21/823412; H01L 21/823418; H01L 29/66742; H01L 29/78618; H01L 29/78696; H01L 29/0847; H01L 29/165; H01L 29/7848; H01L 21/823425; H01L 27/088; H01L 29/0673; H01L 29/66439; H01L 29/66545;
(Continued)

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | |
|---|---|---|
| TW | 202133327 A | 9/2021 |

*Primary Examiner* — Norman D Richards
*Assistant Examiner* — Ethan Edward Cutler
(74) *Attorney, Agent, or Firm* — Slater Matsil, LLP

(57) ABSTRACT

A device includes a first nanostructure over a substrate and a first source/drain region adjacent the first nanostructure. The first source/drain region includes a first epitaxial layer covering a first sidewall of the first nanostructure. The first epitaxial layer has a first concentration of a first dopant. The first epitaxial layer has a round convex profile opposite the first sidewall of the first nanostructure in a cross-sectional view. The first source/drain region further includes a second epitaxial layer covering the round convex profile of the first epitaxial layer in the cross-sectional view. The second epitaxial layer has a second concentration of the first dopant, the second concentration being different from the first concentration.

20 Claims, 43 Drawing Sheets

(51) Int. Cl.
*H10D 30/67* (2025.01)
*H10D 84/01* (2026.01)
*H10D 84/03* (2025.01)

(52) U.S. Cl.
CPC ..... *H10D 30/6757* (2025.01); *H10D 84/0128* (2025.01); *H10D 84/013* (2025.01); *H10D 84/038* (2025.01)

(58) Field of Classification Search
CPC ............. H01L 29/775; H01L 29/42392; H01L 29/0669; H01L 29/0684; H01L 29/66477; H01L 29/66795; H01L 29/78; H01L 29/785; B82Y 10/00; Y02P 70/50
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2021/0273102 | A1* | 9/2021 | Su | H01L 21/823468 |
| 2022/0037498 | A1* | 2/2022 | Lin | H01L 29/66742 |
| 2022/0102152 | A1* | 3/2022 | Chen | H01L 21/823828 |

* cited by examiner

SEMICONDUCTOR SOURCE/DRAIN REGIONS COMPRISING MULTI-LAYERS WITH DIFFERENT DOPANT CONCENTRATIONS AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
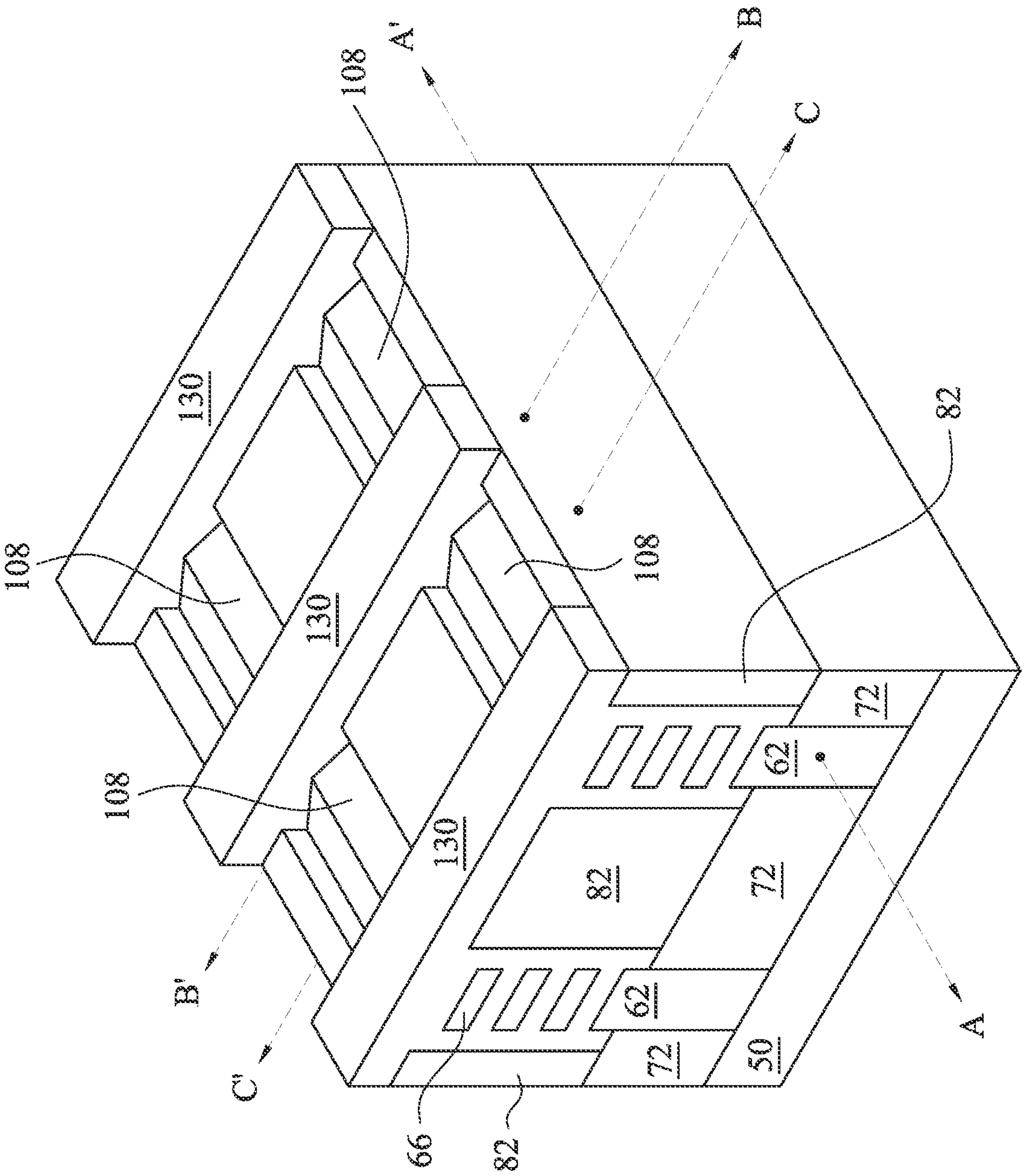
FIG. 1 illustrates an example of nanostructure field-effect transistors (nano-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, first epitaxial layers of source/drain regions are formed over sidewalls of nanostructures to have round convex profiles. The round convex profiles layers allow the first epitaxial layers to have an increased thickness at corners of the nanostructures. The round convex profiles of the first epitaxial layers may be achieved by epitaxial growth, using a low flow rate of an etchant-containing precursor during the epitaxial growth of the first epitaxial layers. increasing the thickness of the first epitaxial layers at the corners of the nanostructures helps decrease junction leakage of dopants from the subsequently formed epitaxial layers of the source/drain regions into the nanostructures.

Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over semiconductor fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 130 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate structures 130. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Insulating fins 82, also referred to as hybrid fins or dielectric fins, are disposed over the isolation regions 72, and between adjacent epitaxial source/drain regions 108. The insulating fins 82 block epitaxial growth to prevent coalescing of some of the epitaxial source/drain regions 108 during epitaxial growth. For example, the insulating fins 82 may be formed at cell boundaries to separate the epitaxial source/drain regions 108 of adjacent cells.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nano-FET. Cross-section B-B' is along a longitudinal axis of a gate structure 130 and in a direction, for example, perpendicular to a direction of current flow between the epitaxial source/drain regions 108 of a nano-FET. Cross-section C-C' is parallel to cross-section B-B' and extends through epitaxial source/drain regions 108 of the nano-FETs. Subsequent figures refer to these reference cross-sections for clarity.

Figure 2:
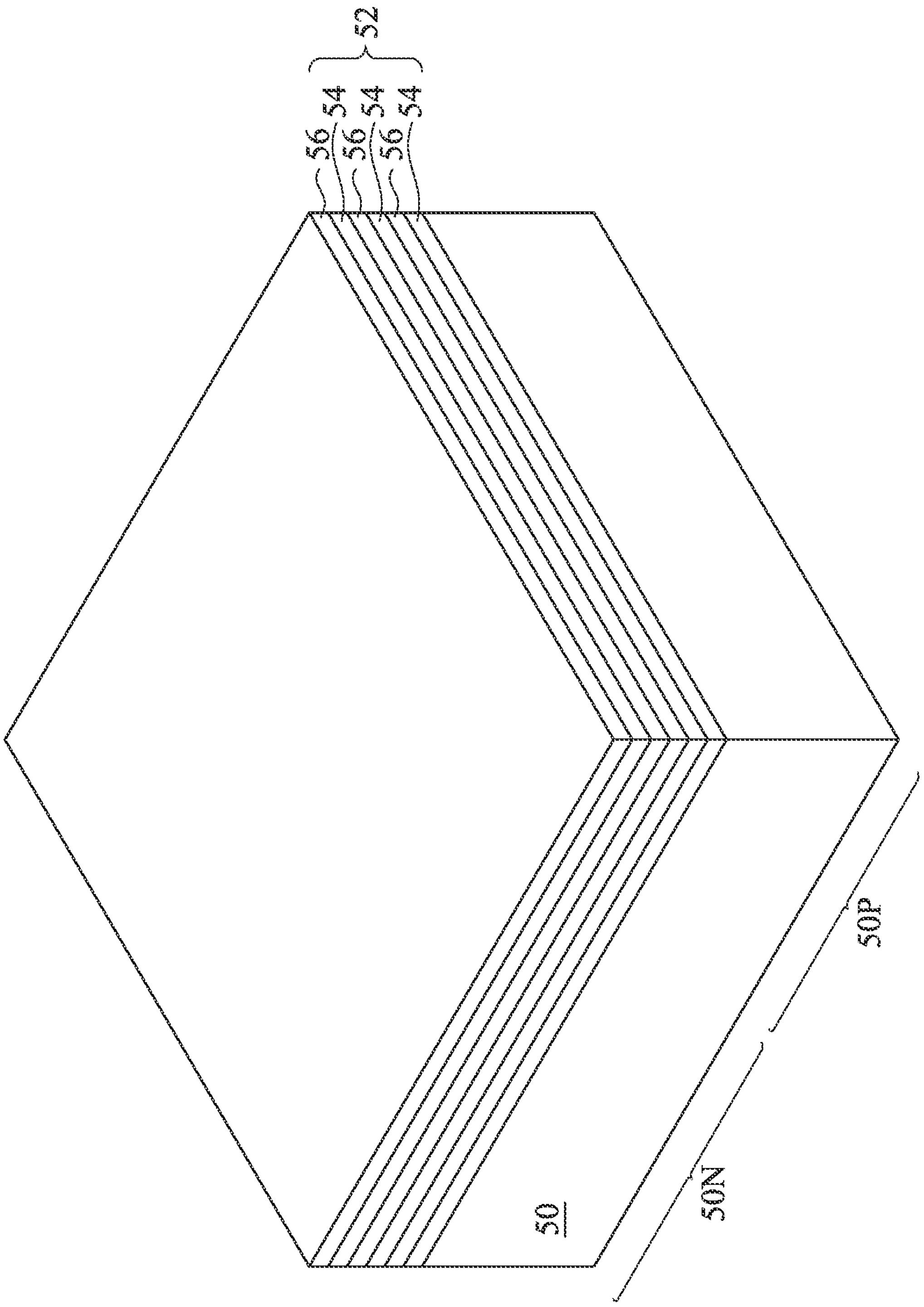
FIGS. 2, 3, 4, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 19A, 19B, 19C, 20A, 20B, 20C, 21A, 21B, 21C, 22A, 22B, 22C, 23A, 23B, 23C, 24A, 24B, 24C, 25A, 25B, and 25C are cross-sectional views of intermediate stages in the manufacturing of nano-FETs, in accordance with some embodiments.
Figure 3:
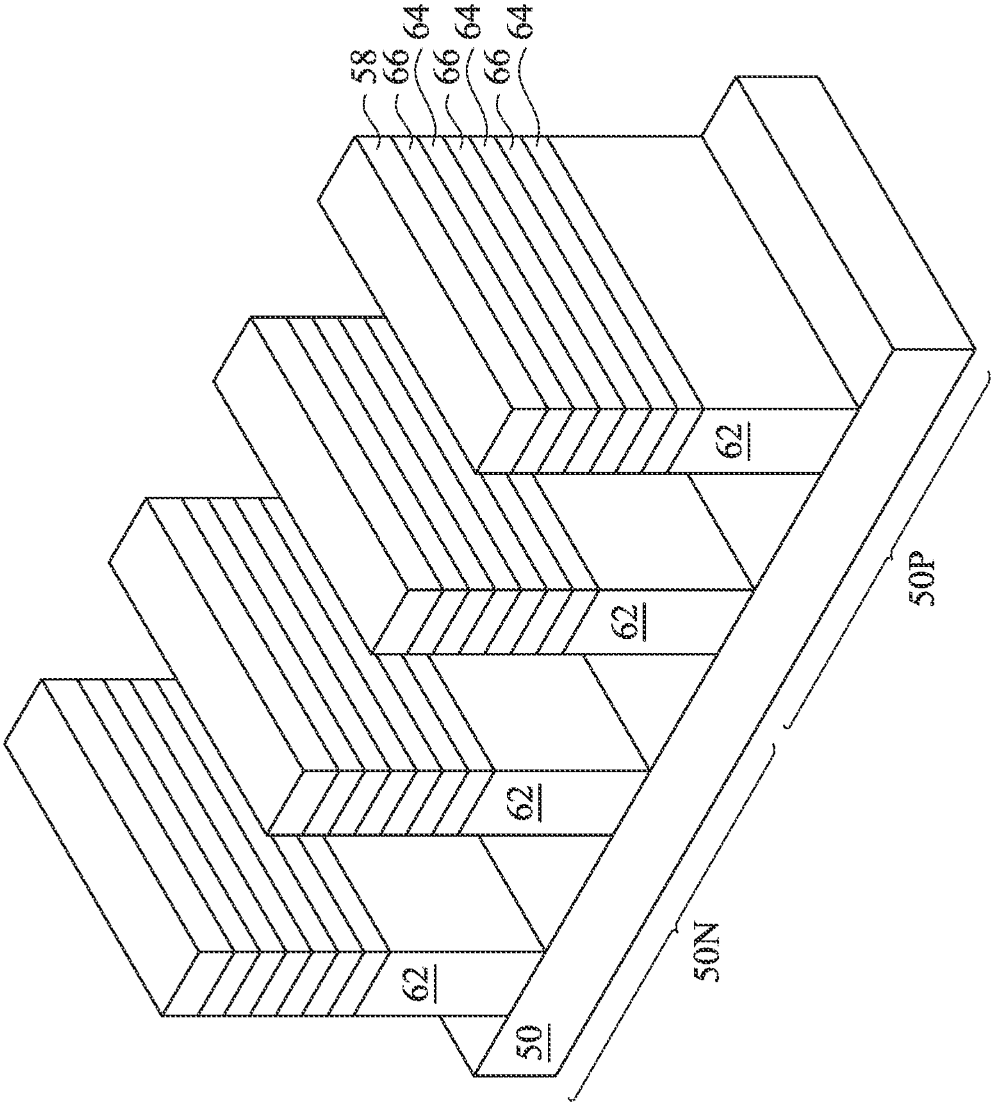
Figure 4:
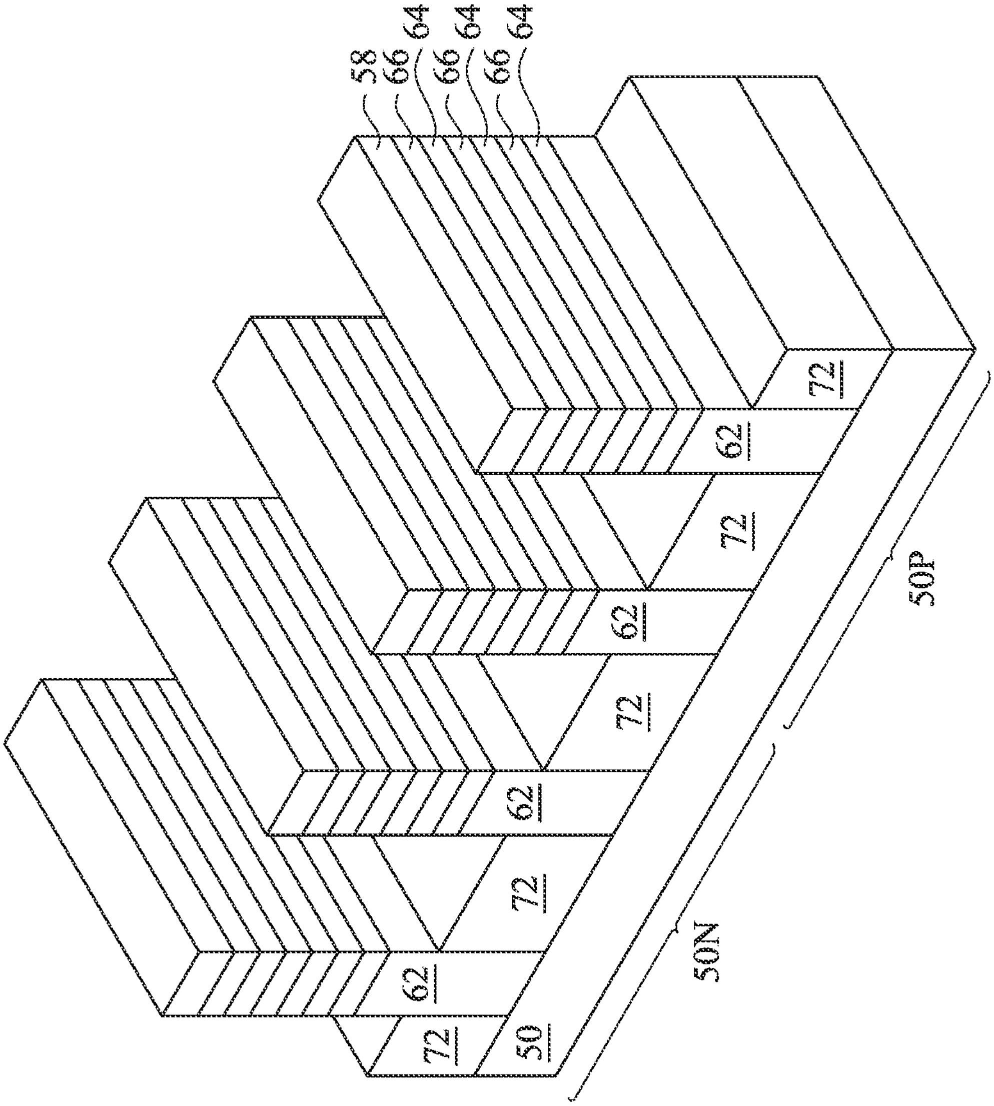

FIGS. 2, 3, 4, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 19A, 19B, 19C, 20A, 20B, 20C, 21A, 21B, 21C, 22A, 22B, 22C, 23A, 23B, 23C, 24A, 24B, 24C, 25A, 25B, and 25C are views of intermediate stages in the manufacturing of nano-FETs, in accordance with some embodiments. FIGS. 2, 3, and 4 are three-dimensional views. FIGS. 5A, 6A, 7A, 8A, 9A, 10A, 11A, 12A, 13A, 14A, 15A, 15B, 15C, 19A, 20A, 21A, 22A, 23A, 24A, and 25A are cross-sectional views illustrated along a similar cross-section as reference cross-section A-A' in FIG. 1. FIGS. 5B, 6B, 7B, 8B, 9B, 10B, 11B, 12B, 13B, 14B, 19B, 20B, 21B, 22B, 23B, 24B, and 25B are cross-sectional views illustrated along a similar cross-section as reference cross-section B-B' in FIG. 1. FIGS. 5C, 6C, 7C, 8C, 9C, 10C, 11C, 12C, 13C, 14C, 19C, 20C, 21C, 22C, 23C, 24C, and 25C are cross-sectional views illustrated along a similar cross-section as reference cross-section C-C' in FIG. 1.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region is in the range of $10^{18}$ $cm^{-3}$ to $10^{19}$ $cm^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In some embodiments, the semiconductor fins 62 and the nanostructures 64, 66 each have widths in a range of 8 nm to 40 nm. In the illustrated embodiment, the semiconductor fins 62 and the nanostructures 64, 66 have substantially equal widths in the n-type region 50N and the p-type region 50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P). Further, while each of the semiconductor fins 62 and the nanostructures 64, 66 are illustrated as having a consistent width throughout, in some embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

In FIG. 4, STI regions 72 are formed over the substrate 50 and between adjacent semiconductor fins 62. The STI regions 72 are disposed around at least a portion of the semiconductor fins 62 such that at least a portion of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and between adjacent semiconductor fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material and the mask 58 (if present) or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the STI regions 72. The insulation material is recessed such that at least a portion of the nanostructures 64, 66 protrude from between adjacent portions of the insulation material. Further, the top surfaces of the STI regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 72 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ $cm^{-3}$ to $10^{14}$ $cm^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 72 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ $cm^{-3}$ to $10^{14}$ $cm^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5A-15C and 19A-25C illustrate various additional steps in the manufacturing of embodiment devices. FIGS. 5A-14C and 19A-25C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. As will be subsequently described in greater detail, insulating fins 82 will be formed between the semiconductor fins 62. FIGS. 5A, 6A, 7A, 8A, 9A, 10A, 11A, 12A 13A, 14A, 15A, 15B, 15C, 19A, 20A, 21A, 22A, 23A, 24A, and 25A illustrate a semiconductor fin 62 and structures formed on it. FIGS. 5B, 5C, 6B, 6C, 7B, 7C, 8B, 8C, 9B, 9C, 10B, 10C, 11B, 11C, 12B, 12C, 13B, 13C, 14B, 14C, 19B, 19C, 20B, 20C, 21B, 21C, 22B, 22C, 23B, 23C, 24B, 24C, 25B, and 25C each illustrate two semiconductor fins 62 and portions of the insulating fins 82 and the STI regions 72 that are disposed between the two semiconductor fins 62 in the respective cross-sections.

Figure 5A:
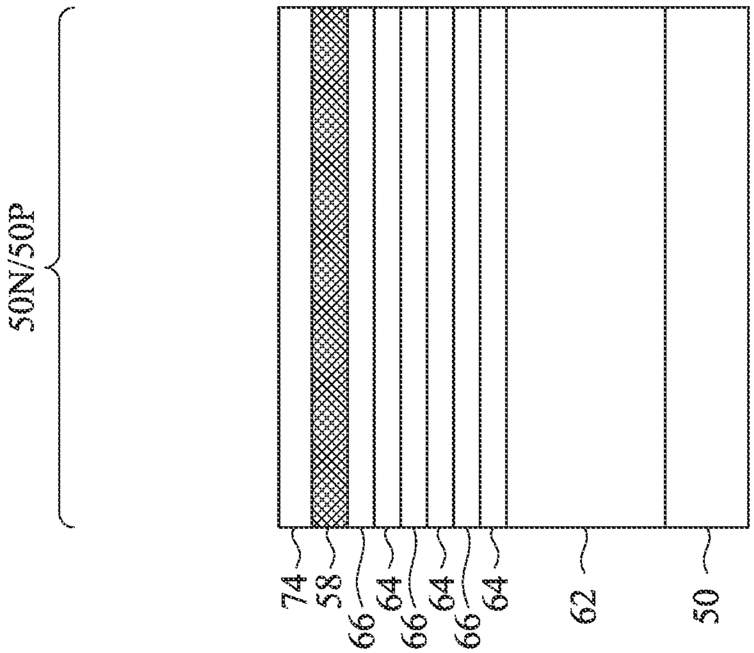
Figure 5C:
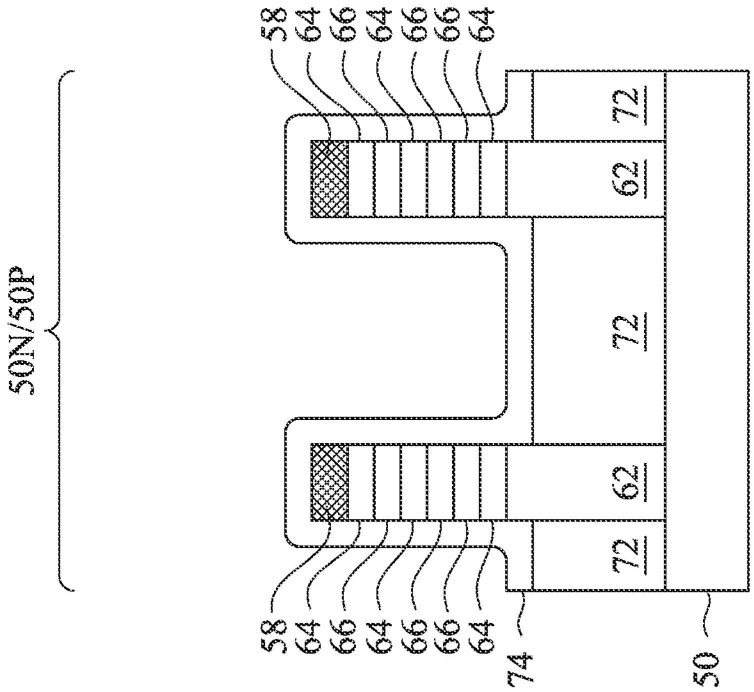
Figure 5B:
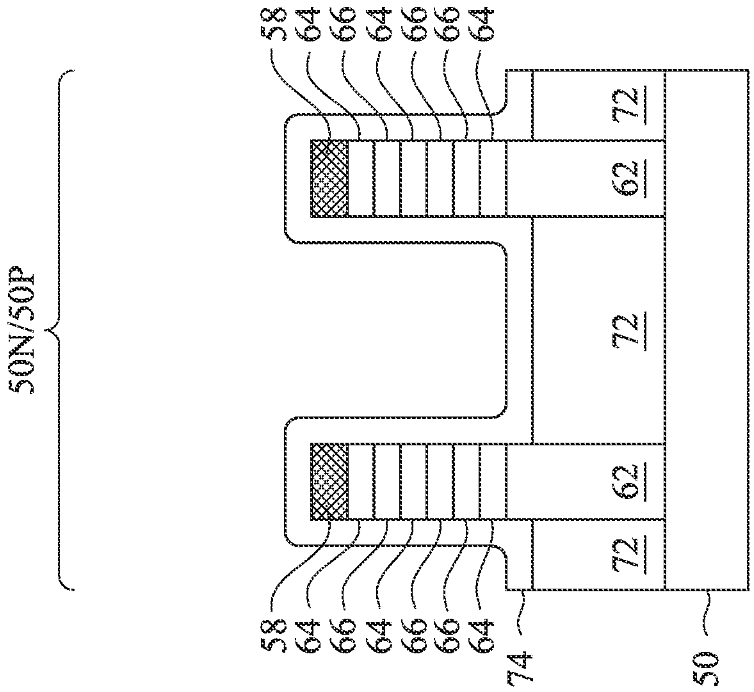

In FIGS. 5A-C, a sacrificial layer 74 is conformally formed over the mask 58 (if present), the semiconductor fins 62, the nanostructures 64, 66, and the STI regions 72. The sacrificial layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial layer 74 may be formed of silicon or silicon germanium.

Figure 6A:
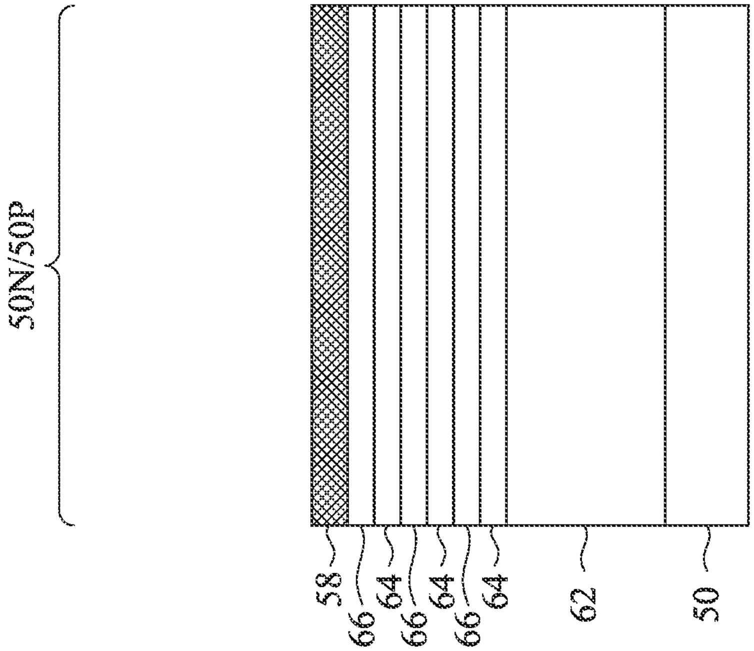
Figure 6B:
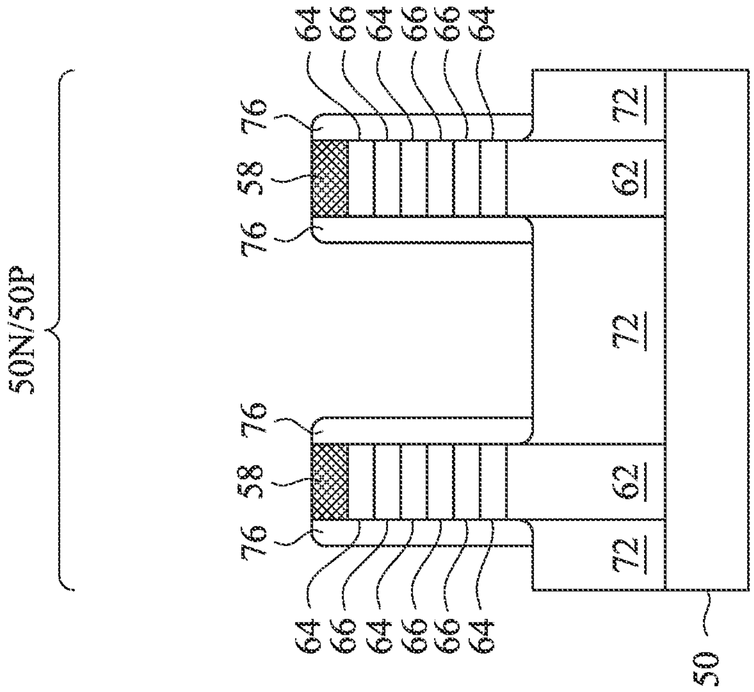
Figure 6C:
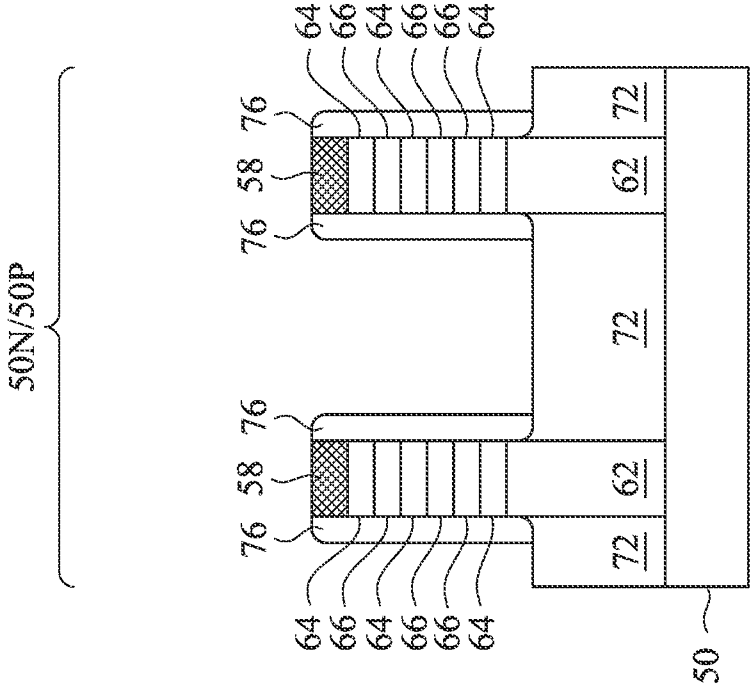

In FIGS. 6A-C, the sacrificial layer 74 is patterned to form sacrificial spacers 76 using an etching process, such as a dry etch, a wet etch, or a combination thereof. The etching process may be anisotropic. As a result of the etching process, the portions of the sacrificial layer 74 over the mask 58 (if present) and the nanostructures 64, 66 are removed, and the STI regions 72 between the nanostructures 64, 66 are partially exposed. The sacrificial spacers 76 are disposed over the STI regions 72 and are further disposed on the sidewalls of the mask 58 (if present), the semiconductor fins 62, and the nanostructures 64, 66.

In subsequent process steps, a dummy gate layer 84 is deposited over portions of the sacrificial spacers 76 (see below, FIGS. 11A-C), and the dummy gate layer 84 may be patterned to provide dummy gates 91 (see below, FIGS. 12A-C). The dummy gates 91, the underlying portions of the sacrificial spacers 76, and the nanostructures 64 are then collectively then replaced with functional gate structures. Specifically, the sacrificial spacers 76 are used as temporary spacers during processing to delineate boundaries of insulating fins, and the sacrificial spacers 76 and the nanostructures 64 will be subsequently removed and replaced with gate structures that are wrapped around the nanostructures 66. The sacrificial spacers 76 are formed of a material that has a high etching selectivity from the etching of the material of the nanostructures 66. For example, the sacrificial spacers 76 may be formed of the same semiconductor material as the nanostructures 64 so that the sacrificial spacers 76 and the nanostructures 64 may be removed in a single process step. Alternatively, the sacrificial spacers 76 may be formed of a different material from the nanostructures 64.

FIGS. 7A through 9C illustrate a formation of insulating fins 82 (also referred to as hybrid fins or dielectric fins) between the sacrificial spacers 76 adjacent to the semiconductor fins 62 and nanostructures 64, 66. The insulating fins 82 may insulate and physically separate subsequently formed source/drain regions (see below, FIGS. 14A-C) from each other.

Figure 7A:
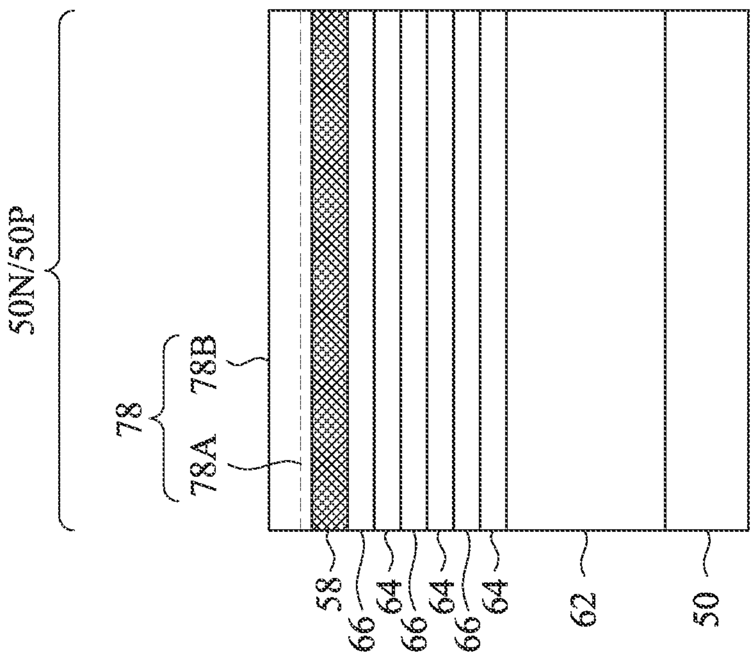
Figure 7C:
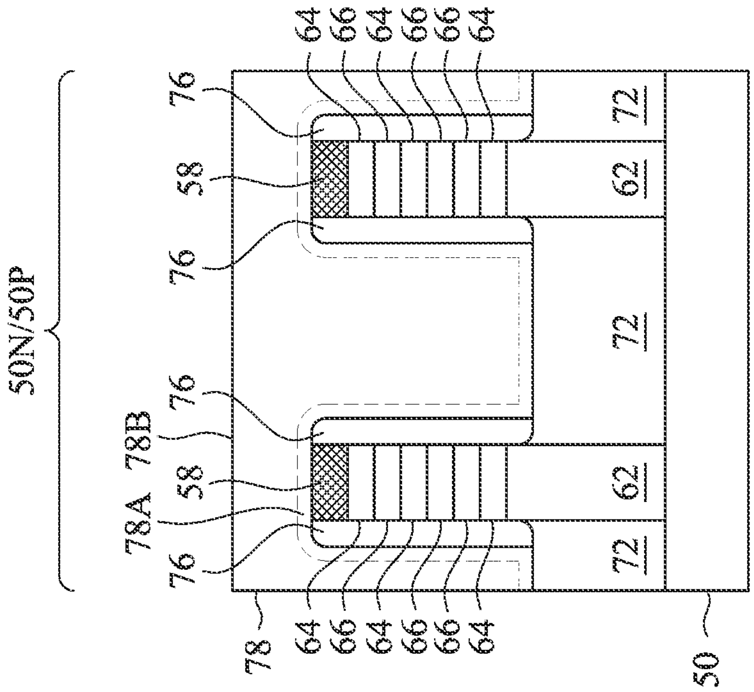
Figure 7B:
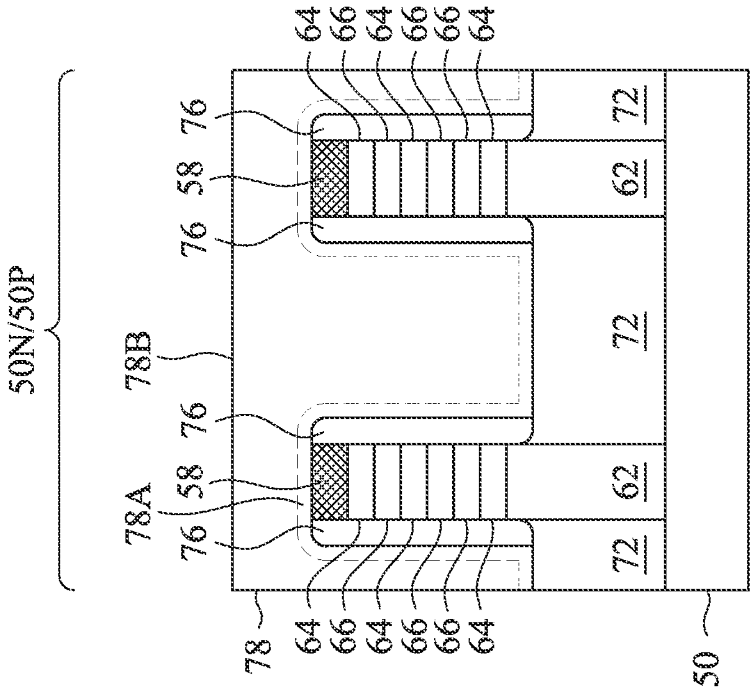

In FIGS. 7A-C, a liner 78A and a fill material 78B are formed over the structure. The liner 78A is conformally deposited over exposed surfaces of the STI regions 72, the mask 58 (if present), the semiconductor fins 62, the nanostructures 64, 66, and the sacrificial spacers 76 by an acceptable deposition process such as atomic layer deposition (ALD), chemical vapor deposition (CVD), physical vapor deposition (PVD), or the like. The liner 78A may be formed of one or more dielectric material(s) having a high etching selectivity from the etching of the semiconductor fins 62, the nanostructures 64, 66, and the sacrificial spacers 76, e.g. a nitride such as silicon nitride, silicon carbonitride, silicon oxycarbonitride, or the like. The liner 78A may reduce oxidation of the sacrificial spacers 76 during the subsequent formation of the fill material 78B, which may be useful for a subsequent removal of the sacrificial spacers 76.

Next, the fill material 78B is formed over the liner 78A, filling the remaining area between the semiconductor fins 62 and the nanostructures 64, 66 that is not filled by the sacrificial spacers 76 or the liner 78A. The fill material 78B may form the bulk of the lower portions of the insulating fins 82 (see FIGS. 9A-C) to insulate subsequently formed source/drain regions (see FIG. 14C) from each other. The fill material 78B may be formed by an acceptable deposition process such as ALD, CVD, PVD, or the like. The fill material 78B may be formed of one or more dielectric material(s) having a high etching selectivity from the etching of the semiconductor fins 62, the nanostructures 64, 66, the sacrificial spacers 76, and the liner 78A such as an oxide such as silicon oxide, silicon oxynitride, silicon oxycarbonitride, silicon oxycarbide, the like, or combinations thereof.

Figure 8A:
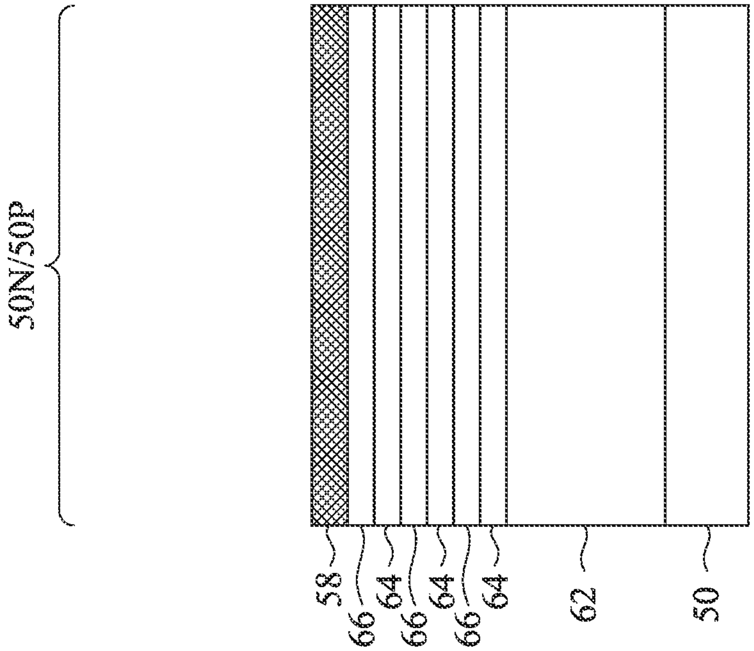
Figure 8C:
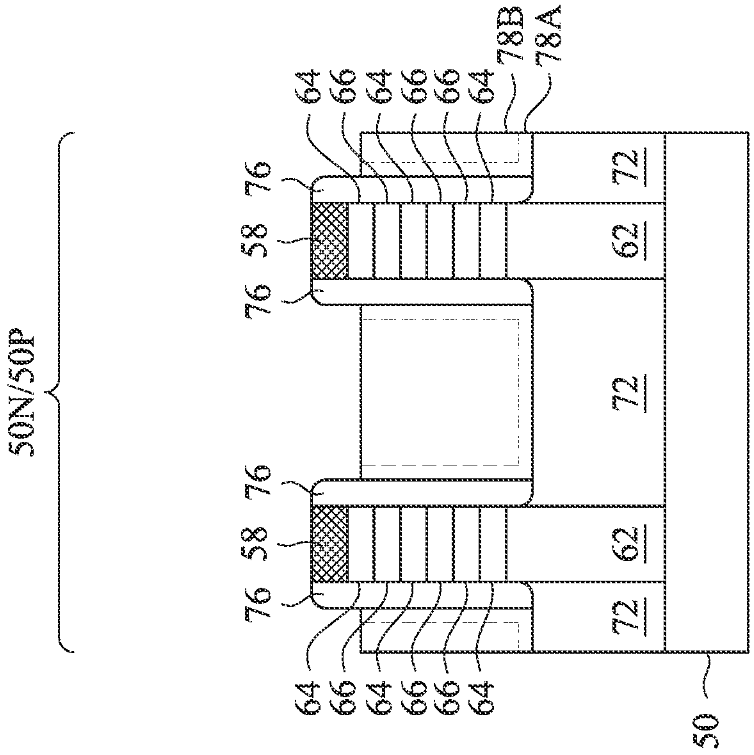
Figure 8B:
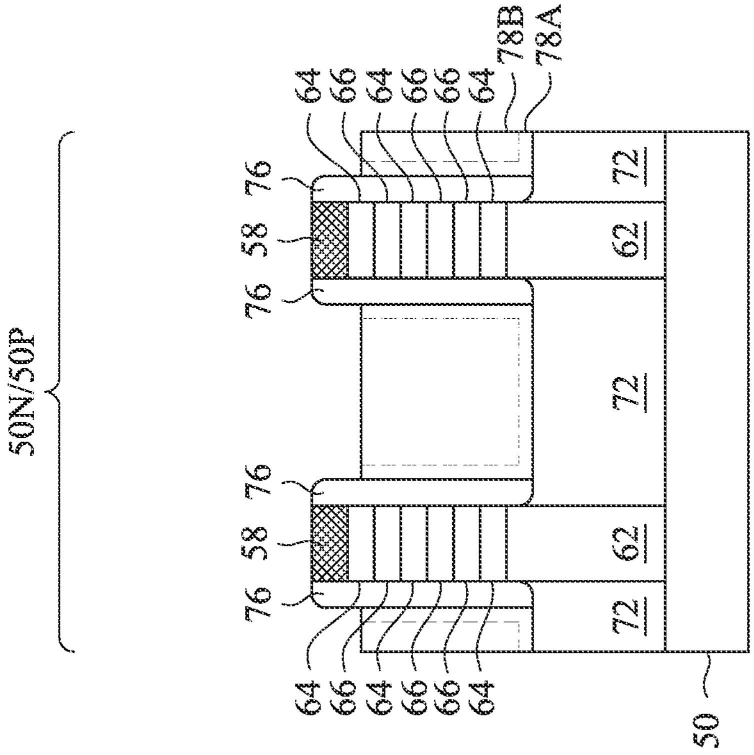

In FIGS. 8A-8C, upper portions of the liner 78A and the fill material 78B above top surfaces of the mask 58 (if present) or the nanostructures 64, 66 may be removed using one or more acceptable planarization and/or etching processes. The etching process may be selective to the liner 78A and to the fill material 78B (e.g., selectively etches the liner 78A and the fill material 78B at a faster rate than the sacrificial spacers 76, the nanostructures 64, 66, and/or the mask 58). After etching, top surfaces of the liner 78A and the fill material 78B may be below top surfaces of the mask 58 or the nanostructures 64, 66. In some embodiments, the fill material 78B may be recessed below top surfaces of the mask 58 or the nanostructures 64, 66 while the liner 78A is maintained at a same level as the mask 58 or the nanostructures 64, 66.

Figure 9A:
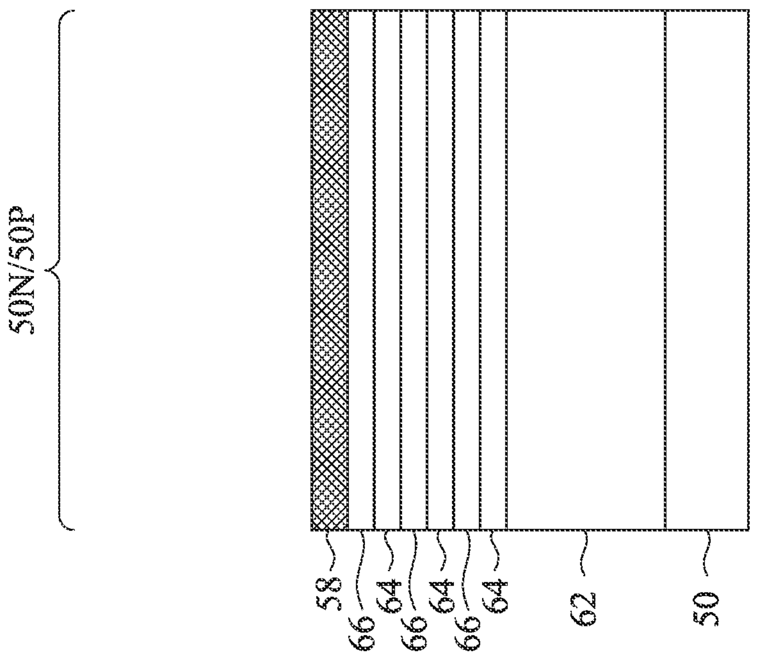
Figure 9B:
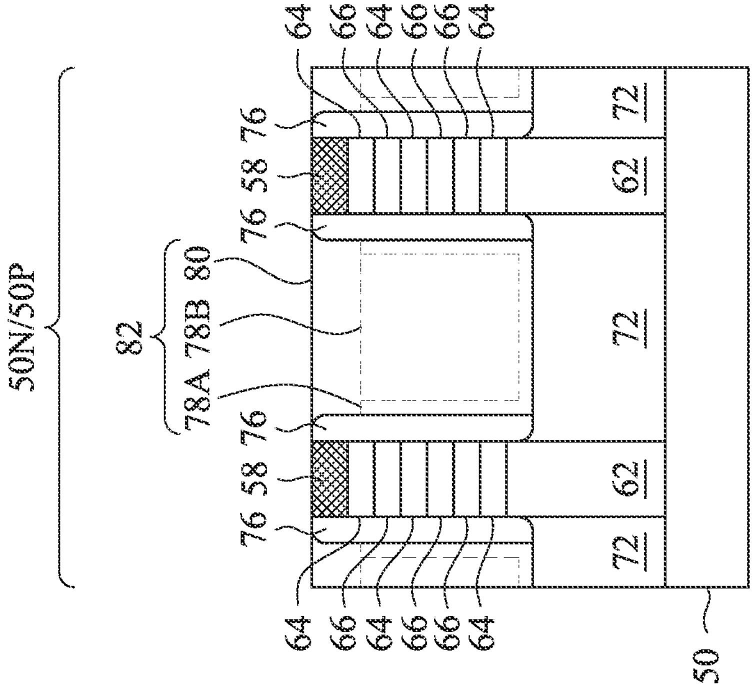
Figure 9C:
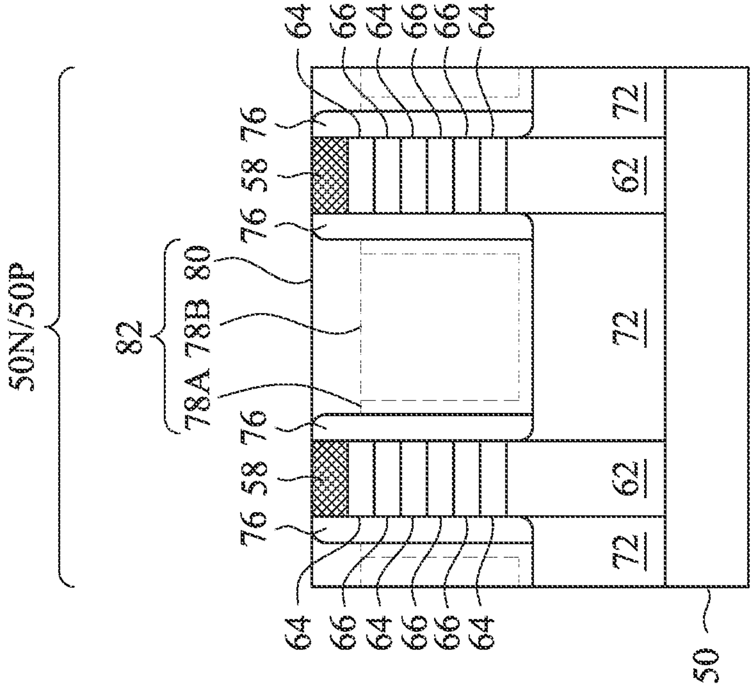

FIGS. 9A-C illustrate the forming of a dielectric capping layer 80 on the liner 78A and the fill material 78B, thereby forming the insulating fins 82. The dielectric capping layer 80 may fill a remaining area over the liner 78A, over the fill material 78B, and between sidewalls of the mask 58 (if present) and the nanostructures 64, 66. The dielectric capping layer 80 may be formed by an acceptable deposition process such as ALD, CVD, PVD, or the like. The dielectric capping layer 80 may be formed of one or more dielectric material(s) having a high etching selectivity from the etching of the semiconductor fins 62, the nanostructures 64, 66, the sacrificial spacers 76, the liner 78A, and the fill material 78B. For example, the dielectric capping layer 80 may comprise a high-k material such as hafnium oxide, zirconium oxide, zirconium aluminum oxide, hafnium aluminum oxide, hafnium silicon oxide, aluminum oxide, the like, or combinations thereof.

The dielectric capping layer 80 may be formed to initially cover the mask 58 (if present) and the nanostructures 64, 66. Subsequently, a removal process is applied to remove excess material(s) of the dielectric capping layer 80. In some embodiments, a planarization process such as a CMP, an etch-back process, combinations thereof, or the like may be utilized. The planarization process may expose the mask 58 (if present) or the nanostructures 64, 66 such that top surfaces of the mask 58 or the nanostructures 64, 66, respectively, and the sacrificial spacers 76, and the dielectric capping layer 80 are coplanar (within process variations). In the illustrated embodiment, the mask 58 remains after the planarization process. In another embodiment, portions of or the entirety of the mask 58 may also be removed by the planarization process.

As a result, insulating fins 82 are formed between and contacting the sacrificial spacers 76. The insulating fins 82 comprise the liner 78A, the fill material 72B, and the dielectric capping layer 80. The sacrificial spacers 76 space the insulating fins 82 apart from the nanostructures 64, 66, and a size of the insulating fins 82 may be adjusted by adjusting a thickness of the sacrificial spacers 76.

Figure 10A:
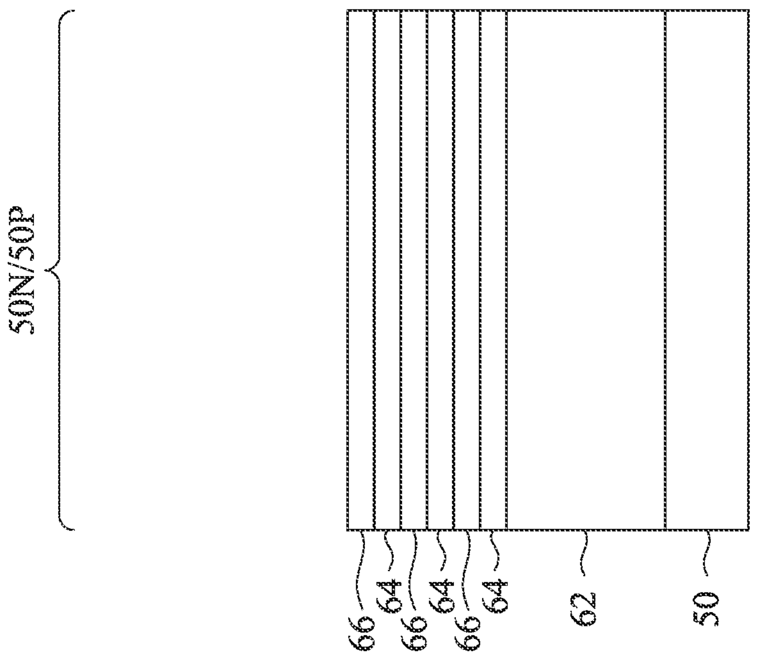
Figure 10C:
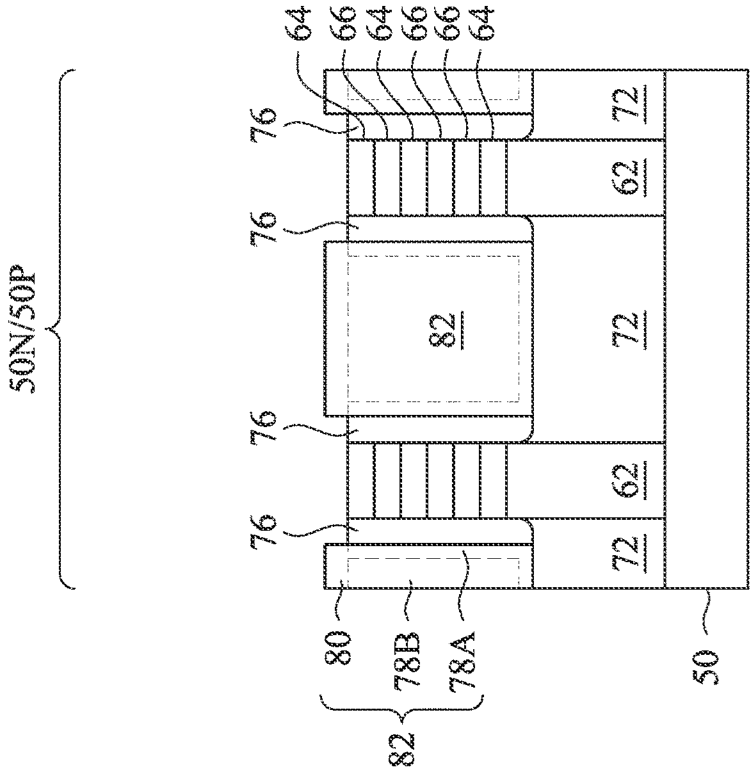
Figure 10B:
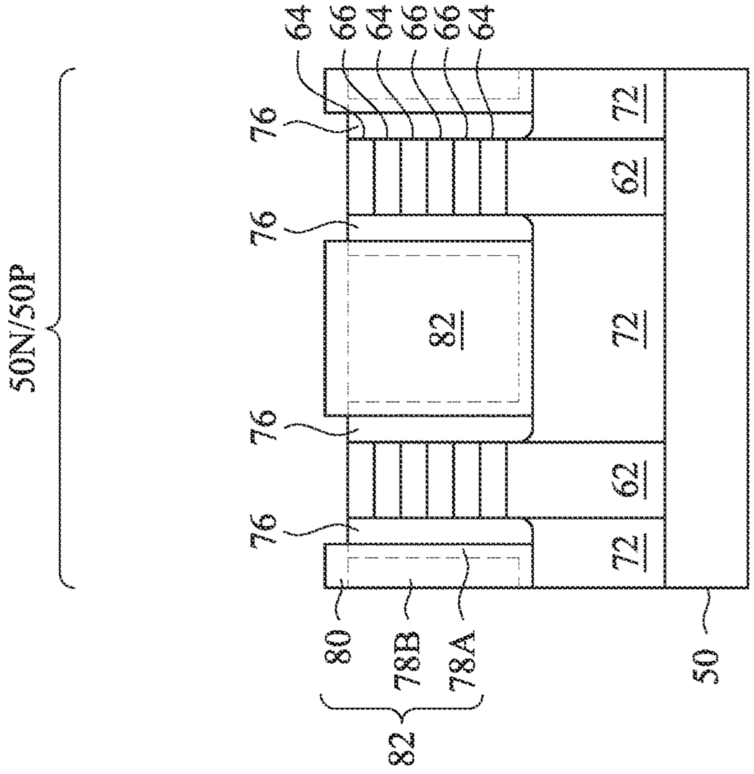

In FIGS. 10A-C, the mask 58 is removed. The mask 58 may be removed using an etching process, for example. The etching process may be a wet etch that selective removes the mask 58 without significantly etching the insulating fins 82. The etching process may be anisotropic. Further, the etching process (or a separate, selective etching process) may also be applied to reduce a height of the sacrificial spacers 76 to a similar level (e.g., same within processing variations) as the stacked nanostructures 64, 66. After the etching process(es), a topmost surface of the stacked nanostructures 64, 66 and the sacrificial spacers 76 may be exposed and may be lower than a topmost surface of the insulating fins 82.

Figure 11A:
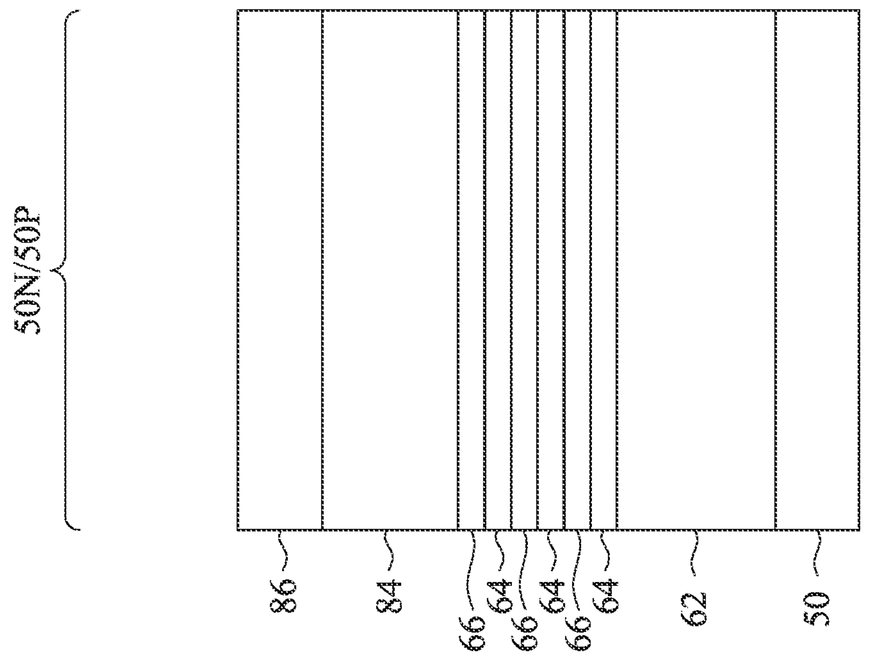
Figure 11C:
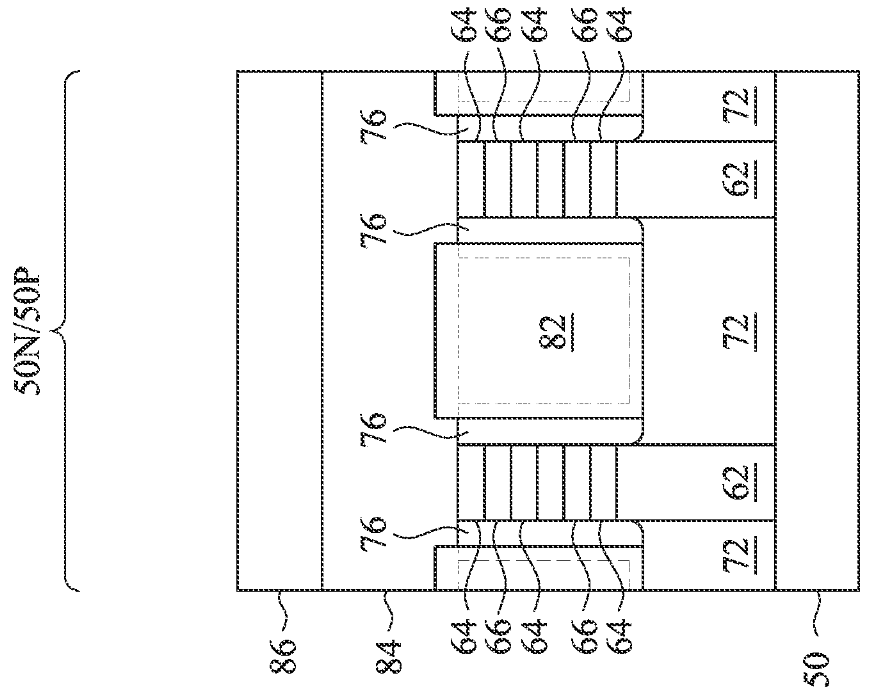
Figure 11B:
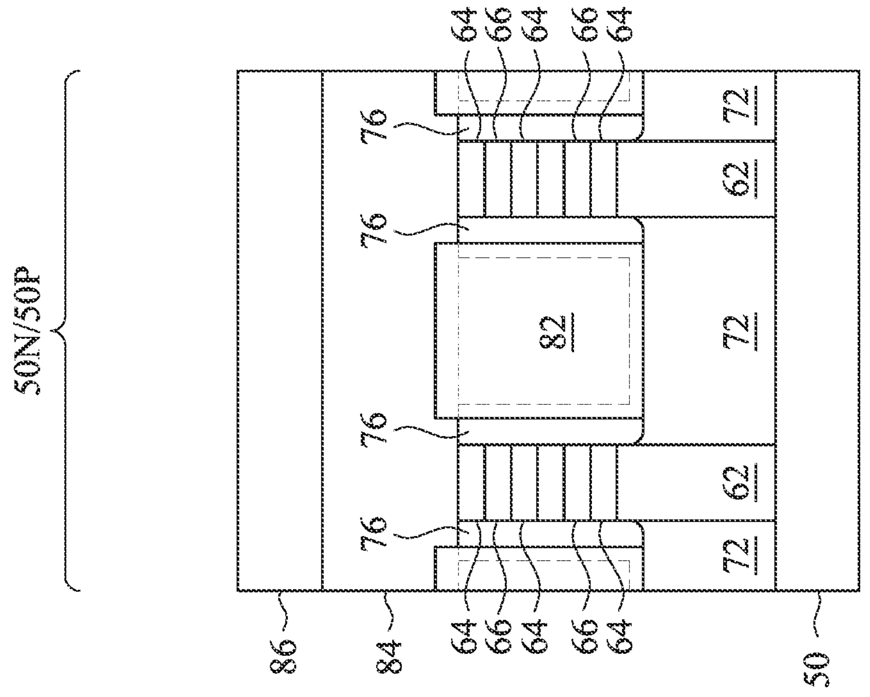

In FIG. 11A-C, a dummy gate layer 84 is formed on the insulating fins 82, the sacrificial spacers 76, and the nanostructures 64, 66. Because the nanostructures 64, 66 and the sacrificial spacers 76 extend lower than the insulating fins 82, the dummy gate layer 84 may be disposed along exposed sidewalls of the insulating fins 82. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the insulating fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

Figure 12A:
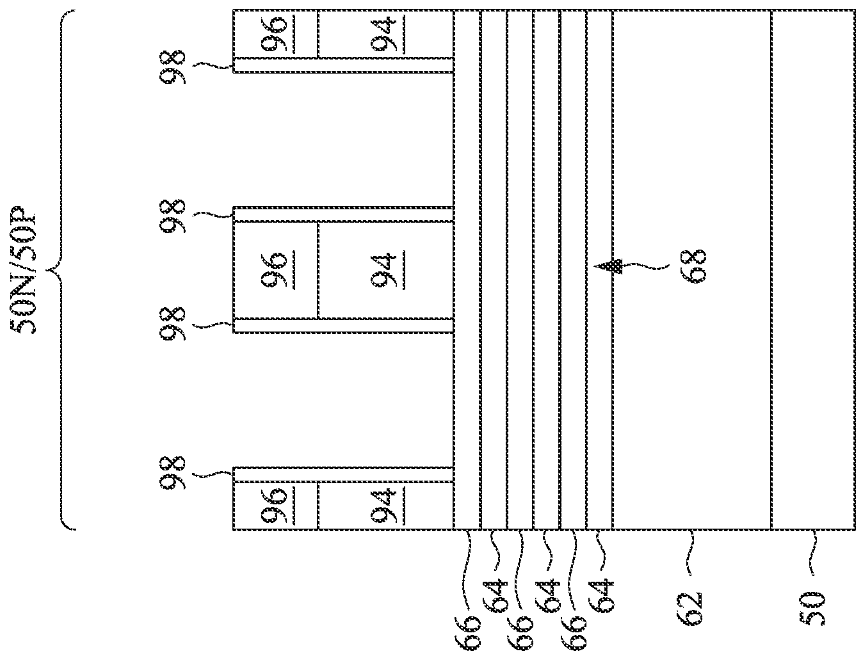
Figure 12C:
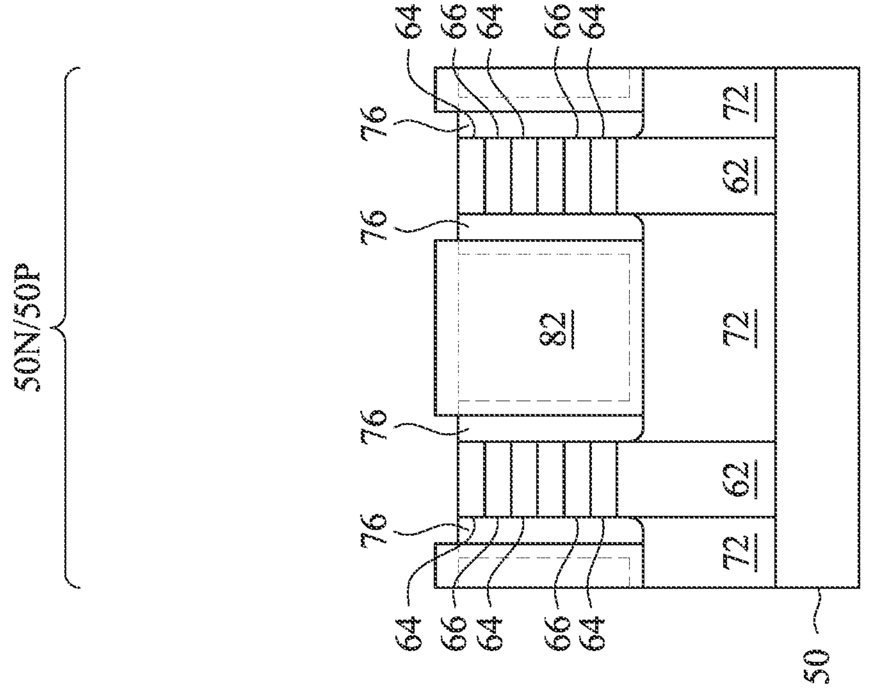
Figure 12B:
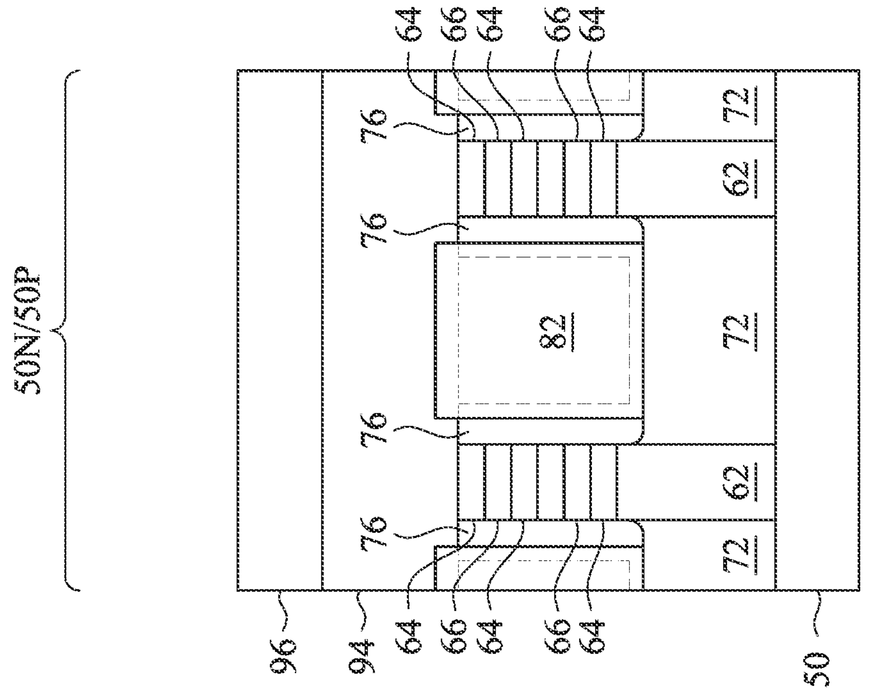

In FIGS. 12A-12C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surfaces of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The sacrificial spacers 76 and the dummy gates 94 collectively extend along the portions of the nanostructures 66 that will be patterned to form channel regions 68. Subsequently formed gate structures will replace the sacrificial spacers 76 and the dummy gates 94. Forming the dummy gates 94 over the sacrificial spacers 76 allows the subsequently formed gate structures to have a greater height.

As noted above, the dummy gates 94 may be formed of a semiconductor material. In such embodiments, the nanostructures 64, the sacrificial spacers 76, and the dummy gates 94 are each formed of semiconductor materials. In some embodiments, the nanostructures 64, the sacrificial spacers 76, and the dummy gates 94 are formed of a same semiconductor material (e.g., silicon germanium), so that during a replacement gate process, the nanostructures 64, the sacrificial spacers 76, and the dummy gates 94 may be removed together in a same etching step. In some embodiments, the nanostructures 64 and the sacrificial spacers 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the sacrificial spacers 76 may be removed together in a second etching step. In some embodiments, the nanostructures 64 are formed of a first semiconductor material (e.g., silicon germanium) and the sacrificial spacers 76 and the dummy gates 94 are formed of a second semiconductor material (e.g., silicon), so that during a replacement gate process, the sacrificial spacers 76 and the dummy gates 94 may be removed together in a first etching step, and the nanostructures 64 may be removed in a second etching step.

Gate spacers 98 are formed over the nanostructures 64, 66, and on exposed sidewalls of the masks 96 (if present) and the dummy gates 94. The gate spacers 98 may be formed by conformally depositing one or more dielectric material(s) on the dummy gates 94 and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ $cm^{-3}$ to $10^{19}$ $cm^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 13A:
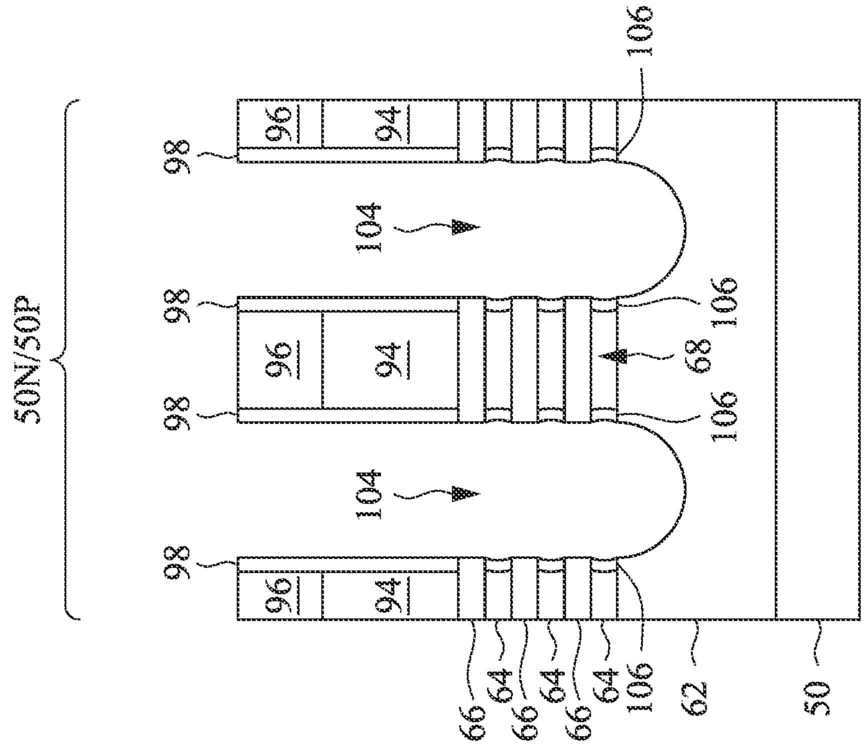
Figure 13C:
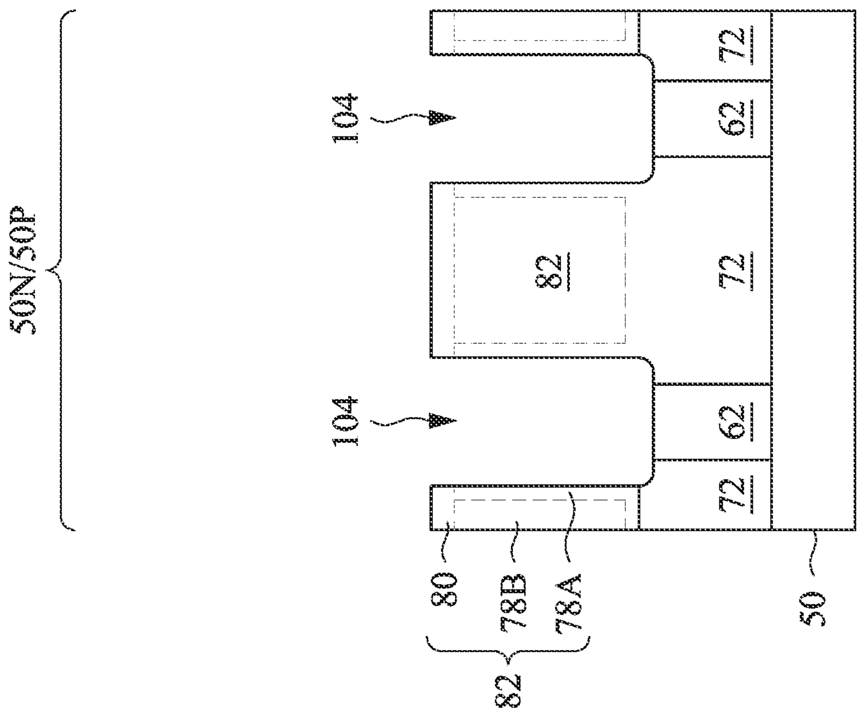
Figure 13B:
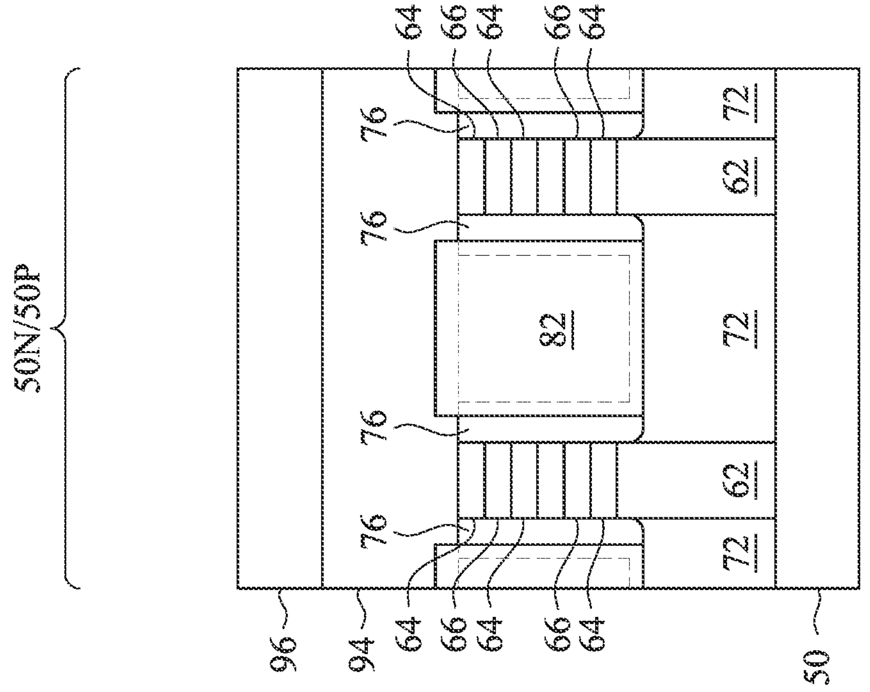

In FIGS. 13A-C, source/drain recesses 104 are formed in the nanostructures 64, 66 and the sacrificial spacers 76. In the illustrated embodiment, the source/drain recesses 104 extend through the nanostructures 64, 66 and the sacrificial spacers 76 into the semiconductor fins 62. The source/drain recesses 104 may also extend into the substrate 50. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the STI regions 72; or the like. The source/drain recesses 104 may be formed by etching the nanostructures 64, 66 and the sacrificial spacers 76 using an anisotropic etching process, such as a RIE, a NBE, or the like. The gate spacers 98 and the dummy gates 94 collectively mask portions of the semiconductor fins 62 and/or the nanostructures 64, 66 during the etching processes used to form the source/drain recesses 104. A single etch process may be used to etch each of the nanostructures 64, 66 and the sacrificial spacers 76, or multiple etch processes may be used to etch the nanostructures 64, 66 and the sacrificial spacers 76. Timed etch processes may be used to stop the etching of the source/drain recesses 104 after the source/drain recesses 104 reach a desired depth.

Optionally, inner spacers 106 are formed on the sidewalls of the nanostructures 64, e.g., those sidewalls exposed by the source/drain recesses 104. As will be subsequently described in greater detail, source/drain regions will be subsequently formed in the source/drain recesses 104, and the nanostructures 64 will be subsequently replaced with corresponding gate structures. The inner spacers 106 act as isolation features between the subsequently formed source/drain regions and the subsequently formed gate structures. Further, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being concave, the sidewalls may be straight or convex. The sidewalls may be recessed by any acceptable etching process, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 104 and recess the sidewalls of the nanostructures 64. The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 106 are illustrated as being recessed with respect to the sidewalls of the gate spacers 98, the outer sidewalls of the inner spacers 106 may extend beyond or be flush with the sidewalls of the gate spacers 98. In other words, the inner spacers 106 may partially fill, completely fill, or overfill the sidewall recesses. Moreover, although the sidewalls of the inner spacers 106 are illustrated as being concave, the sidewalls of the inner spacers 106 may be straight or convex.

Figure 14A:
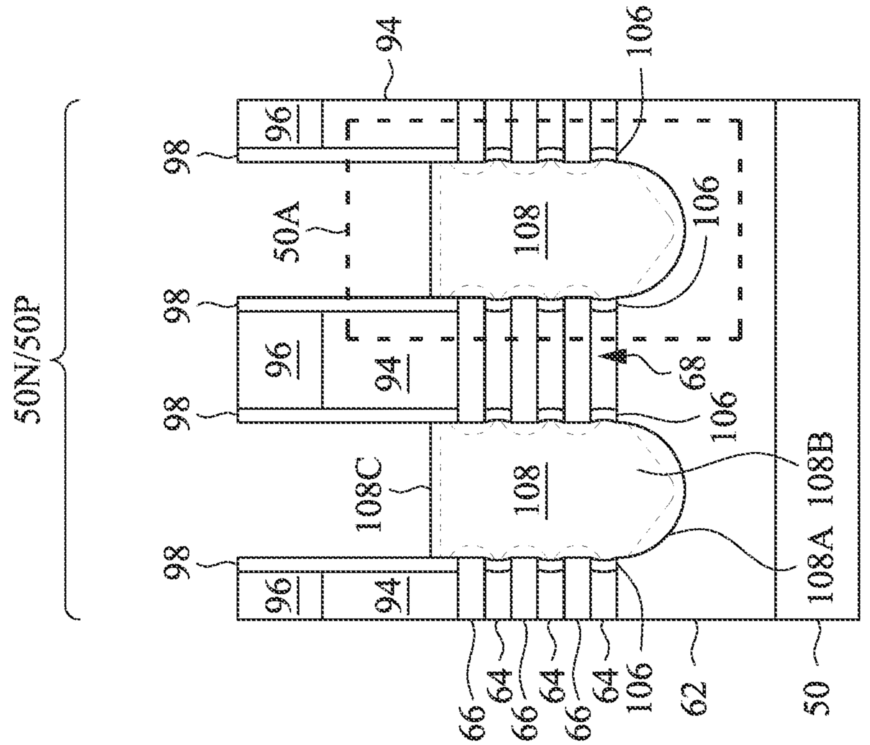
Figure 14C:
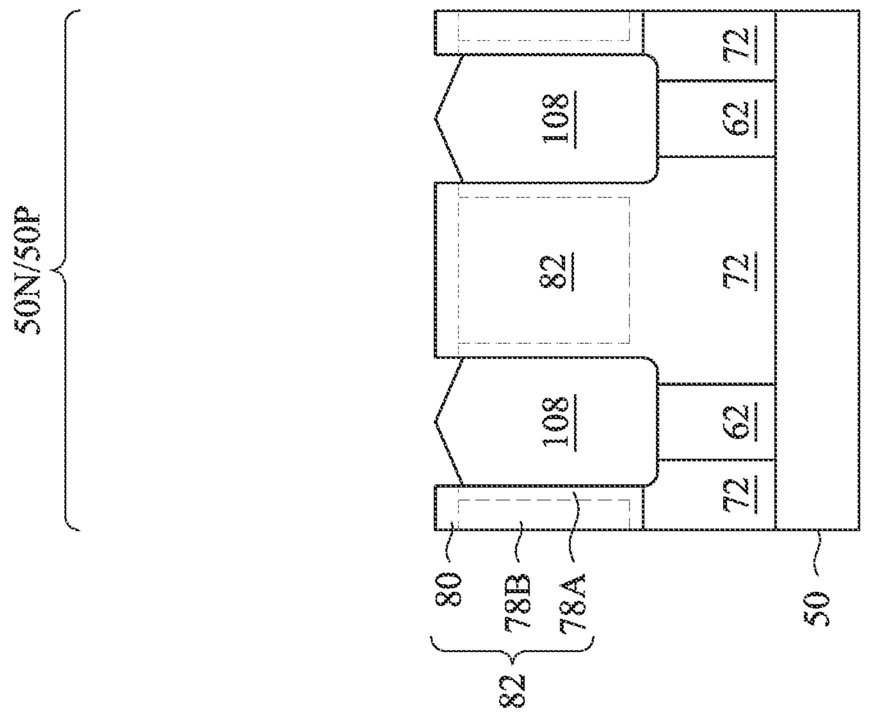
Figure 14B:
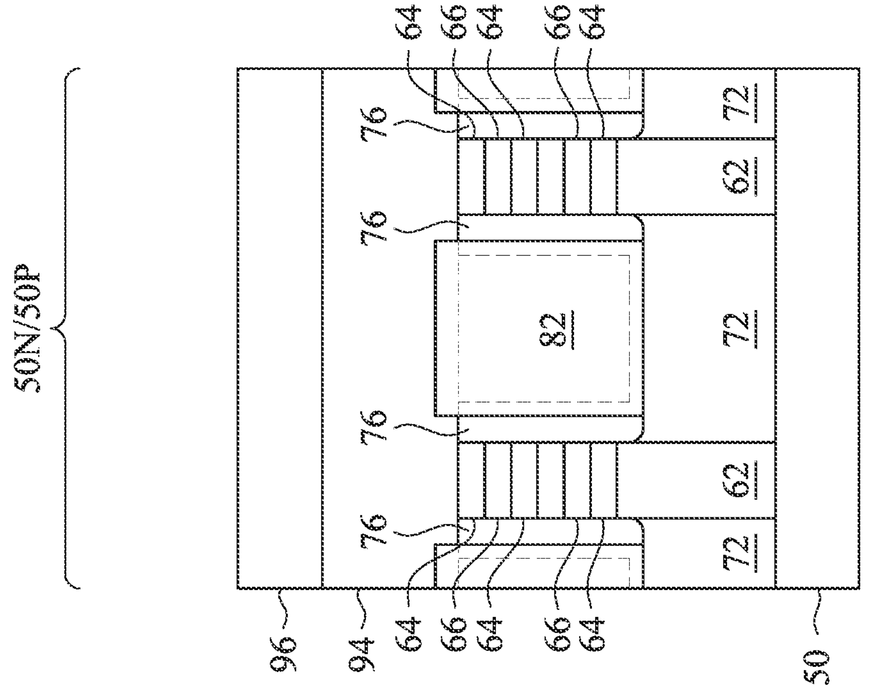

In FIGS. 14A-C epitaxial source/drain regions 108 are formed in the source/drain recesses 104. The epitaxial source/drain regions 108 are formed in recesses 104 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nano-FETs. A material of the epitaxial source/drain regions 108 may be selected to exert stress in the respective channel regions 68, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 104 in the n-type region 50N. The epitaxial source/drain regions 108 may include any acceptable material appropriate for n-type devices. For example, if the nanostructures 66 are silicon, the epitaxial source/drain regions 108 in the n-type region 50N may include materials exerting a tensile strain on the channel regions 68, such as silicon, silicon carbide, phosphorous doped silicon carbide, silicon arsenide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 62 and the nanostructures 64, 66, and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 104 in the p-type region 50P. The epitaxial source/drain regions 108 may include any acceptable material appropriate for p-type devices. For example, if the nanostructures 66 are silicon, the epitaxial source/drain regions 108 in the p-type region 50P may include materials exerting a compressive strain on the channel regions 68, such as silicon germanium, boron doped silicon germanium, silicon germanium phosphide, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 62 and the nanostructures 64, 66, and may have facets.

The epitaxial source/drain regions 108, the nanostructures 64, 66, and/or the semiconductor fins 62 may be implanted with impurities to form source/drain regions, similar to the process previously described for forming LDD regions, followed by an anneal. The epitaxial source/drain regions 108 may have an impurity concentration in the range of $10^{19}$ $cm^{-3}$ to $10^{21}$ $cm^{-3}$. The n-type and/or p-type impurities for source/drain regions may be any of the impurities previously described. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer 108A, a main layer 108B, and a finishing layer 108C (or more generally, a first semiconductor material layer, a second semiconductor material layer, and a third semiconductor material layer). Any number of semiconductor material layers may be used for the epitaxial source/drain regions 108. Each of the liner layer 108A, the main layer 108B, and the finishing layer 108C may be formed of different semiconductor materials and may be doped to different impurity concentrations. In some embodiments, the liner layers 108A have a lesser concentration of impurities than the main layers 108B, and the finishing layers 108C have a greater concentration of impurities than the liner layers 108A and a lesser concentration of impurities than the main layers 108B. In embodiments in which the epitaxial source/drain regions include three semiconductor material layers, and as will be subsequently described in greater detail for FIGS. 15A-15C, the liner layers 108A may be grown in the source/drain recesses 104, the main layers 108B may be grown on the liner layers 108A, and the finishing layers 108C may be grown on the main layers 108B.

As a result of the epitaxy processes used to form the epitaxial source/drain regions 108, upper surfaces of the epitaxial source/drain regions 108 have facets which expand laterally outward beyond sidewalls of the semiconductor fins 62 and the nanostructures 64, 66. However, the insulating fins 82 block the lateral epitaxial growth. Therefore, adjacent epitaxial source/drain regions 108 remain separated after the epitaxy process is completed as illustrated by FIG. 14C. The epitaxial source/drain regions 108 contact the sidewalls of the insulating fins 82. In the illustrated embodiment, the epitaxial source/drain regions 108 are grown so that the upper surfaces of the epitaxial source/drain regions 108 are disposed below the top surfaces of the insulating fins 82. In various embodiments, the upper surfaces of the epitaxial source/drain regions 108 are disposed above the top surfaces of the insulating fins 82; the upper surfaces of the epitaxial source/drain regions 108 have portions disposed above and below the top surfaces of the insulating fins 82; or the like.

Figure 15A:
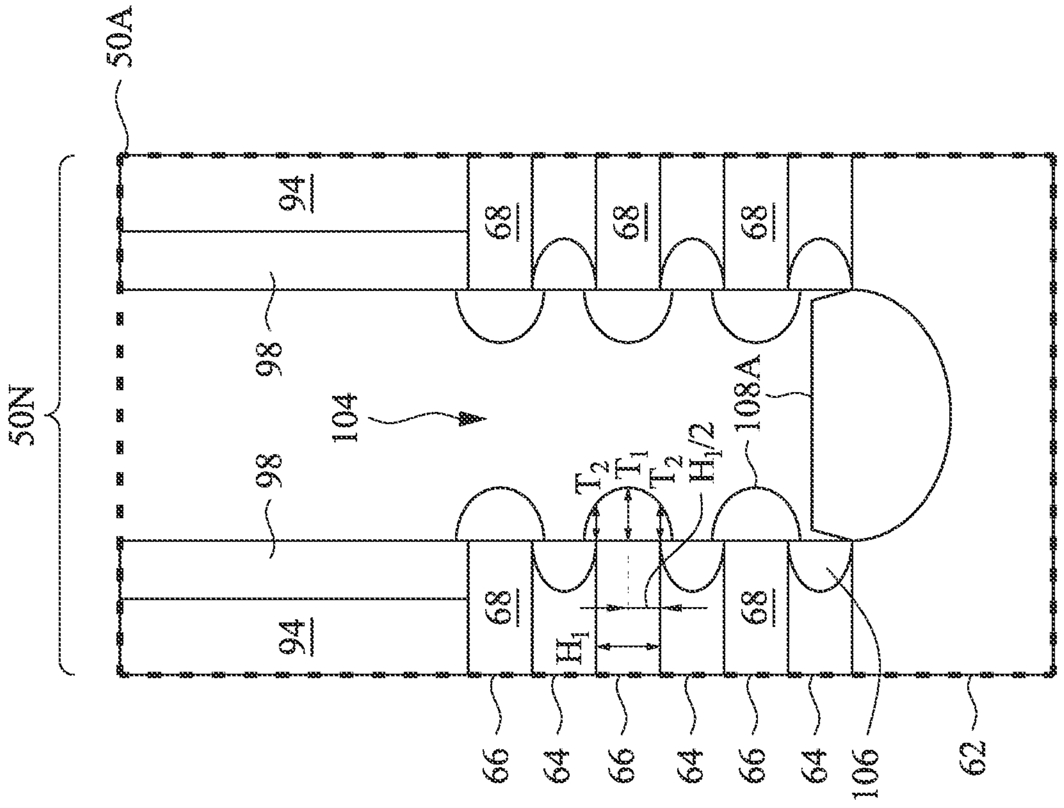
Figure 15C:
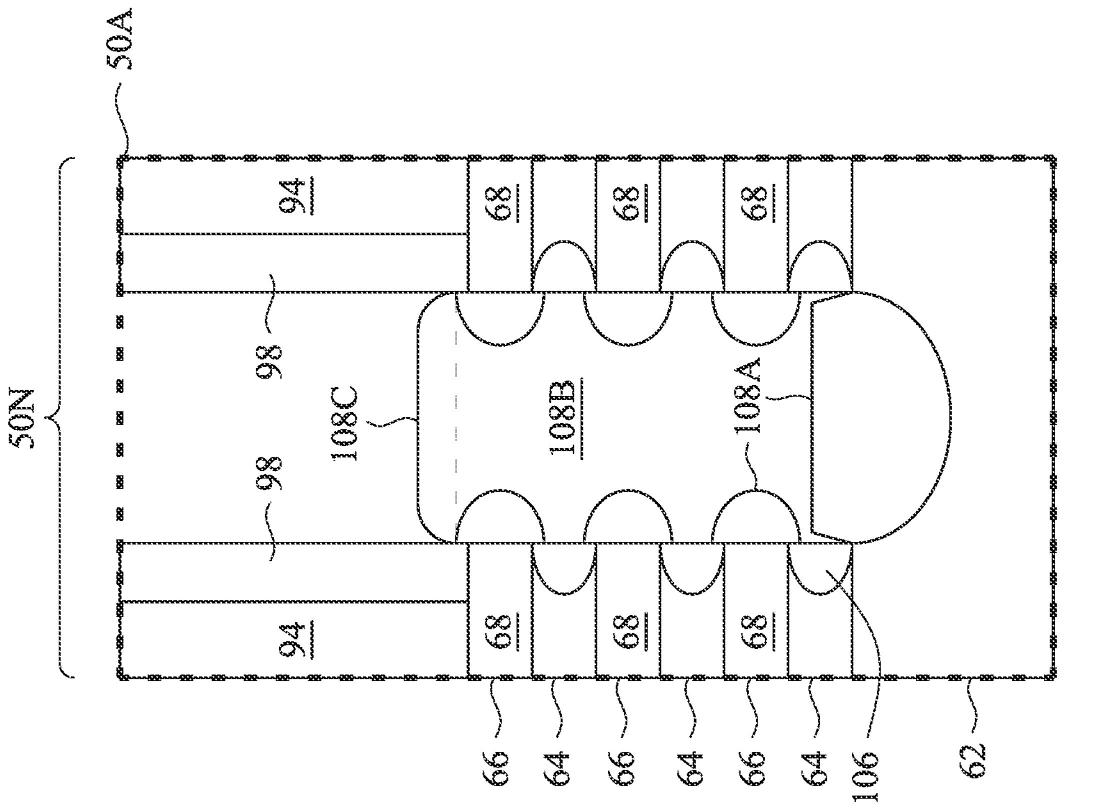
Figure 15B:
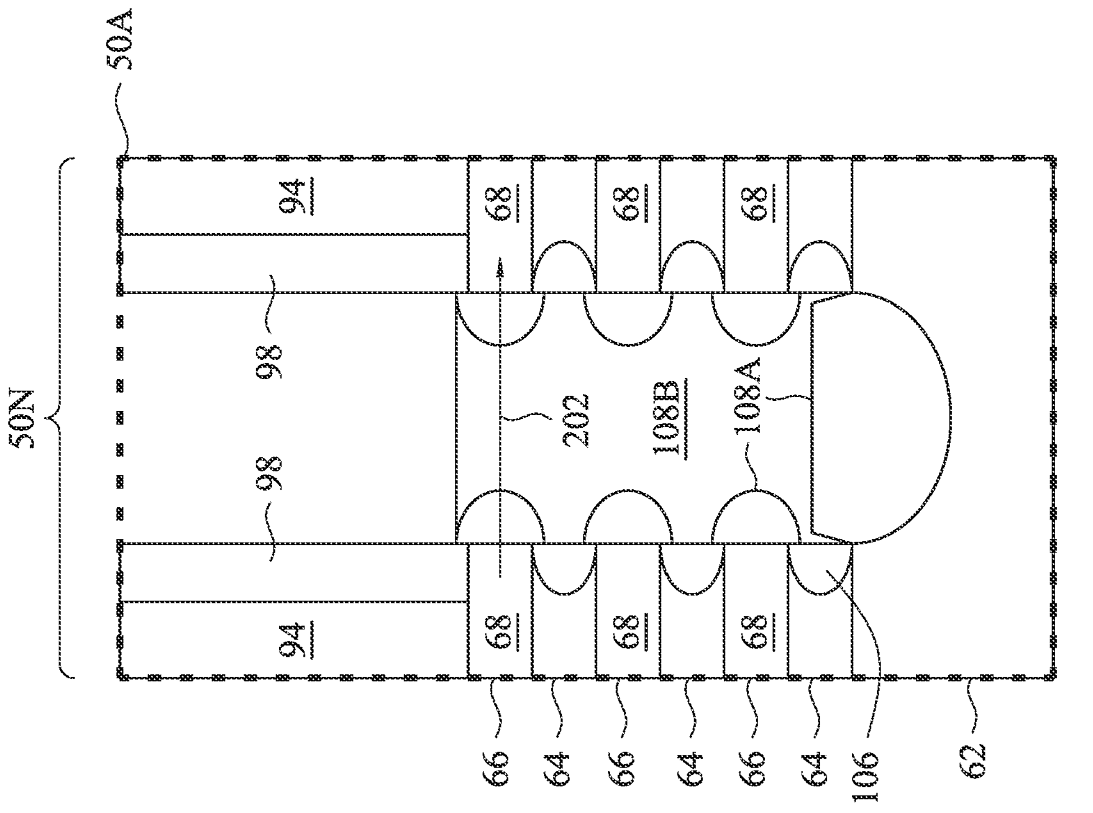

FIGS. 15A-15C illustrate a process for forming the epitaxial source/drain regions 108 in the n-type region 50N. FIGS. 15A-15C are detailed views of features in a region 50A in FIG. 14A. The epitaxial source/drain regions 108 in the n-type region 50N are formed with the liner layers 108A having round convex profiles and covering portions of the sidewalls of the nanostructures 66. The round convex profiles of the liner layers 108A provide increased thickness of the liner layers 108A at corners of the nanostructures 66, which helps decrease junction leakage of dopants from the subsequently formed main layer 108B into the channel regions 68.

In FIG. 15A, liner layers 108A (also referred to as first epitaxial layers) are formed in the source/drain recesses 104 in the n-type region 50N. The liner layers 108A are epitaxially grown from exposed surfaces of semiconductor features (e.g., surfaces of the fins 62 and the second nanostructures 66) in the source/drain recesses 104. The portions of the liner layers 108A on the exposed sidewalls of the nanostructures 66 are formed to have round convex profiles opposite the sidewalls of the nanostructures 66. The portions of the liner layers 108A on the exposed surfaces of the semiconductor fins 62 are formed to have flat top surfaces. In some embodiments, the round convex profiles of the liner layers 108A are semicircular in a cross-sectional view. As will be subsequently described in greater detail, forming the portions of the liner layers 108A covering sidewalls of the nanostructures 66 with round convex profiles can help reduce junction leakage of an n-type dopant (e.g. phosphorus) from subsequently formed overlying main layers 108B (see below, FIG. 15B) into the channel regions 68.

A first portion of a liner layer 108A covers a respective sidewall of a nanostructure 66, and a second portion of the liner layer 108A extending from the semiconductor fin 62 has a flat top surface. The first portion of the liner layer 108A has a round (e.g., semicircular) convex profile opposite the sidewall of a nanostructure 66, and the first portion of the liner layer 108A extends over portions of the inner spacers 106 above and below the nanostructure 66. The round convex profile of the first portion of the liner layer 108A is advantageous for decreasing junction leakage from subsequently formed overlying main layers 108B (see below, FIG. 15B) into the nanostructures 66. In some embodiments, the nanostructures have heights $H_1$ in a range of 1 nm to 50 nm. A first thickness $T_1$ of the first portion of the liner layer 108A is measured across the first portion of the liner layer 108A at a midpoint of the nanostructure 66, equidistant from a top surface and a bottom surface of the nanostructure 66 by a height $H_1/2$. In some embodiments, the first thickness $T_1$ is in a range of 2 nm to 8 nm. A second thickness $T_2$ of the first portion of the liner layer 108A is measured at a point which is level with the top surface and/or the bottom surface of the nanostructure 66. In some embodiments, the second thickness $T_2$ is in a range of 1.4 nm to 8 nm.

In some embodiments, a ratio of the second thickness $T_2$ to the first thickness $T_1$ is in a range of 0.7 to 1.0, which is advantageous for decreasing junction leakage from subsequently formed overlying main layers 108B (see below, FIG. 15B) into the nanostructures 66. The ratio of $T_2$:$T_1$ being less than 0.7 may be disadvantageous by leading to increased junction leakage from the overlying main layers 108B into the nanostructures 66. The ratio of $T_2$:$T_1$ being greater than 1.0 may be disadvantageous by increasing the resistance of the epitaxial source/drain region 108, thereby reducing device performance.

Figure 16:
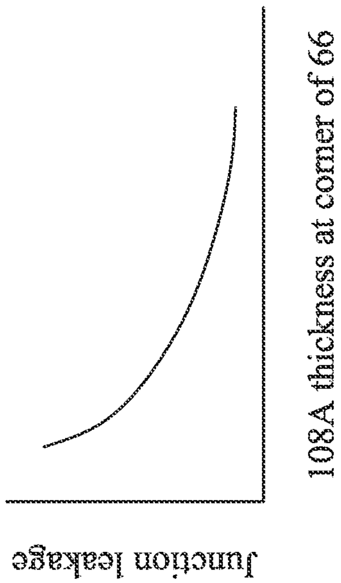
FIG. 16 schematically illustrates junction leakage as a function of a thickness of an epitaxial layer, in accordance with some embodiments.

FIG. 16 illustrates the relationship between junction leakage from the subsequently formed overlying main layers 108B (see below, FIG. 15B) into the channel region 68 and thickness $T_2$ of the first portion of a liner layer 108A at corners of a nanostructure 66. As the thickness $T_2$ of the first portion of the liner layer 108A at corners of the nanostructure 66 increases, junction leakage of the dopant from the overlying main layer 108B through corners of the nanostructure 66 into the channel region 68 decreases. Forming the first portion of the liner layer 108A with a round convex profile allows the thickness $T_2$ to be increased by a desired amount without increasing the thickness $T_1$ by an undesired amount. The reduced junction leakage provided by the round convex profile of the first portion of the liner layer 108A may advantageously reduce Drain-Induced-Barrier-Lowering (DIBL) and improve device performance.

The liner layers 108A are formed of a semiconductor (e.g., silicon) doped with an n-type dopant such as arsenic or phosphorus. The n-type dopant of the liner layers 108A may be the same or different from an n-type dopant of the subsequently formed overlying main layers 108B (see below, FIG. 15B). In some embodiments, the liner layers 108A are formed of silicon arsenide (SiAs). Arsenic has a low diffusion rate and may help block diffusion, and hence may help reduce the diffusion of n-type dopants from the overlying main layers 108B into the channel regions 68. The dopant concentration of arsenic in the liner layers 108A may be in a range of $5\times10^{19}/cm^3$ and $1.5\times10^{21}/cm^3$, which is advantageous for reducing dopant diffusion from the subsequently formed overlying main layers 108B into the channel regions 68, thereby helping decrease junction leakage. The dopant concentration of arsenic in the liner layers 108A being less than $5\times10^{19}/cm^3$ may be disadvantageous by increasing the resistance of the epitaxial source/drain region 108, reducing device performance. The dopant concentration of arsenic in the liner layers 108A being greater than $1.5\times10^{21}/cm^3$ may be disadvantageous by increasing dopant diffusion from the subsequently formed overlying main layers 108B into the channel regions 68, thereby increasing junction leakage of arsenic into the channel regions 68. In some embodiments, the liner layers 108A are formed of silicon phosphide (SiP). The dopant concentration of phosphorus in the liner layers 108A may be in a range of $5\times10^{19}/cm^3$ and $1.5\times10^{21}/cm^3$, which is advantageous for reducing dopant diffusion from the subsequently formed overlying main layers 108B into the channel regions 68, thereby decreasing junction leakage from the subsequently formed main layers 108B into the channel regions 68. The dopant concentration of phosphorus in the liner layers 108A being less than $5\times10^{19}/cm^3$ may be disadvantageous by increasing the resistance of the epitaxial source/drain region 108, reducing device performance. The dopant concentration of phosphorus in the liner layers 108A being greater than $1.5\times10^{21}/cm^3$ may be disadvantageous by increasing dopant diffusion from the subsequently formed overlying main layers 108B into the channel regions 68, thereby increasing junction leakage of phosphorus into the channel regions 68.

The epitaxial growth of the liner layers 108A may be performed using Chemical Vapor Deposition (CVD), Molecular beam epitaxy (MBE), Reduced pressure Chemical Vapor Deposition (RPCVD), Plasma Enhanced Chemical Vapor Deposition (PECVD), or the like. The liner layers 108A may be grown from the nanostructures 66 and the semiconductor fins 62 by exposing the nanostructures 66 and the semiconductor fins 62 to a semiconductor-containing precursor, an etchant-containing precursor, and a dopant-containing precursor. The semiconductor-containing precursor may be a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. The etchant-containing precursor may be a chlorine-containing precursor such as hydrochloric acid (HCl) or the like. When the dopant is arsenic, the dopant-containing precursor may be an arsenic-containing precursor such as arsine ($AsH_3$) or the like. When the dopant is phosphorous, the dopant-containing precursor may be a phosphorous-containing precursor such as phosphine ($PH_3$), diphosphine ($P_2H_6$), phosphorus trichloride ($PCl_3$), or the like. In some embodiments, the round convex profiles of the portions of the liner layers 108A covering exposed sidewalls of the nanostructures 66 and the flat top surfaces of the liner layers 108A on exposed surfaces of the semiconductor fins 62 are formed by flowing a silicon-containing precursor (e.g., DCS) together with a small proportion of a chlorine-containing precursor (e.g., HCl). This reduces the formation of facets in the portions of the liner layers 108A formed on sidewalls of the nanostructures 66, leading to round convex profiles of the portions of the liner layers 108A on the sidewalls of the nanostructures 66.

Figure 17:
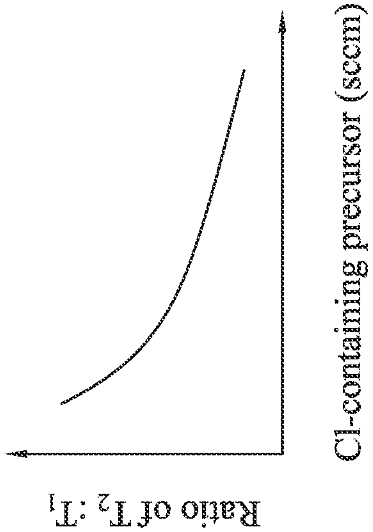
FIG. 17 schematically illustrates a ratio of thicknesses of an epitaxial layer as a function of a flow rate of a chlorine-containing precursor, in accordance with some embodiments.

FIG. 17 illustrates a graph of the relationship between the ratio of $T_2$:$T_1$ (previously described) and the flow rate of the chlorine-containing precursor (e.g., HCl) during the epitaxial growth of the liner layers 108A. As the flow rate of Cl-containing precursor is decreased, the ratio of $T_2$:$T_1$ increases. This is due to the reduction of the growth of facets in the portions of the liner layers 108A covering sidewalls of the nanostructures 66 from reduced chlorine passivation on exposed surfaces of the nanostructures 66 with (111) orientation. This reduced chlorine passivation increases the (111) growth rate of the liner layers 108A, leading to round convex profiles of the portions of the liner layers 108A covering sidewalls of the nanostructures 66 and an increase in the ratio of $T_2$:$T_1$.

In some embodiments, the round convex profiles of the portions of the liner layers 108A covering exposed sidewalls of the nanostructures 66 and the flat top surfaces of the liner layers 108A on exposed surfaces of the semiconductor fins 62 are formed by flowing a silicon-containing precursor (e.g., DCS) and a chlorine-containing precursor (e.g., HCl) with a ratio of a flow rate of DCS to a flow rate of HCl in a range of 10 to 15. Utilizing a ratio of flow rates in this range allows the ratio of $T_2$:$T_1$ to be in a desired range (previously described). The ratio of the flow rate of DCS to the flow rate of HCl being less than 10 or greater than 15 may not allow the ratio of $T_2$:$T_1$ to be in the desired range.

In some embodiments, the liner layers 108A are epitaxially grown with a flow rate of DCS in a range of 500 to 1000 sccm and with a flow rate of HCl in a range of 13 to 300 sccm When the dopant of the liner layers 108A is phosphorus, in some embodiments, the liner layers 108A are epitaxially grown with a flow rate of phosphine ($PH_3$), diphosphine ($P_2H_6$), phosphorus trichloride ($PCl_3$), or the like in a range of 10 sccm to 600 sccm, which produces a dopant concentration of phosphorus in the liner layers 108A in a range of $5\times10^{19}/cm^3$ and $1.5\times10^{21}/cm^3$. As noted above, this is advantageous for the diffusion of n-type dopants from the subsequently formed main layers 108B (see below, FIG. 15B) into the channel regions 68. When the dopant of the liner layers 108A is arsenic, in some embodiments, the liner layers 108A are epitaxially grown with a flow rate of arsine ($AsH_3$) or the like in a range of 10 to 600 sccm, which produces a dopant concentration of arsenic in the liner layers 108A in a range of $5\times10^{19}/cm^3$ and $1.5\times10^{21}/cm^3$. This is advantageous for decreasing junction leakage from the subsequently formed main layers 108B into the channel regions 68.

In some embodiments, the second nanostructures 66 and the semiconductor fins 62 are exposed to the semiconductor-containing precursor, the etchant-containing precursor, and the dopant-containing precursor at a temperature in a range of 500° C. to 800° C., at a pressure in a range of 1 Torr to 760 Torr, and for a duration in a range of 5 seconds to 40 minutes. Growing the liner layers 108A at a temperature and at a pressure in these ranges allows the liner layers 108A to have a desired thickness and round convex profile shape (previously described). Growing the liner layers 108A at a temperature or at a pressure outside of these ranges may not allow the liner layers 108A to have the desired thickness or round convex profile shape, leading to junction leakage from the subsequently formed main layers 108B into the channel regions 68.

In FIG. 15B, main layers 108B (also referred to as second epitaxial layers) are formed on the liner layers 108A. In some embodiments, the main layers 108B cover exposed surfaces of the liner layers 108A and fill the source/drain recesses 104 up to top surfaces of the liner layers 108A.

Figure 18:
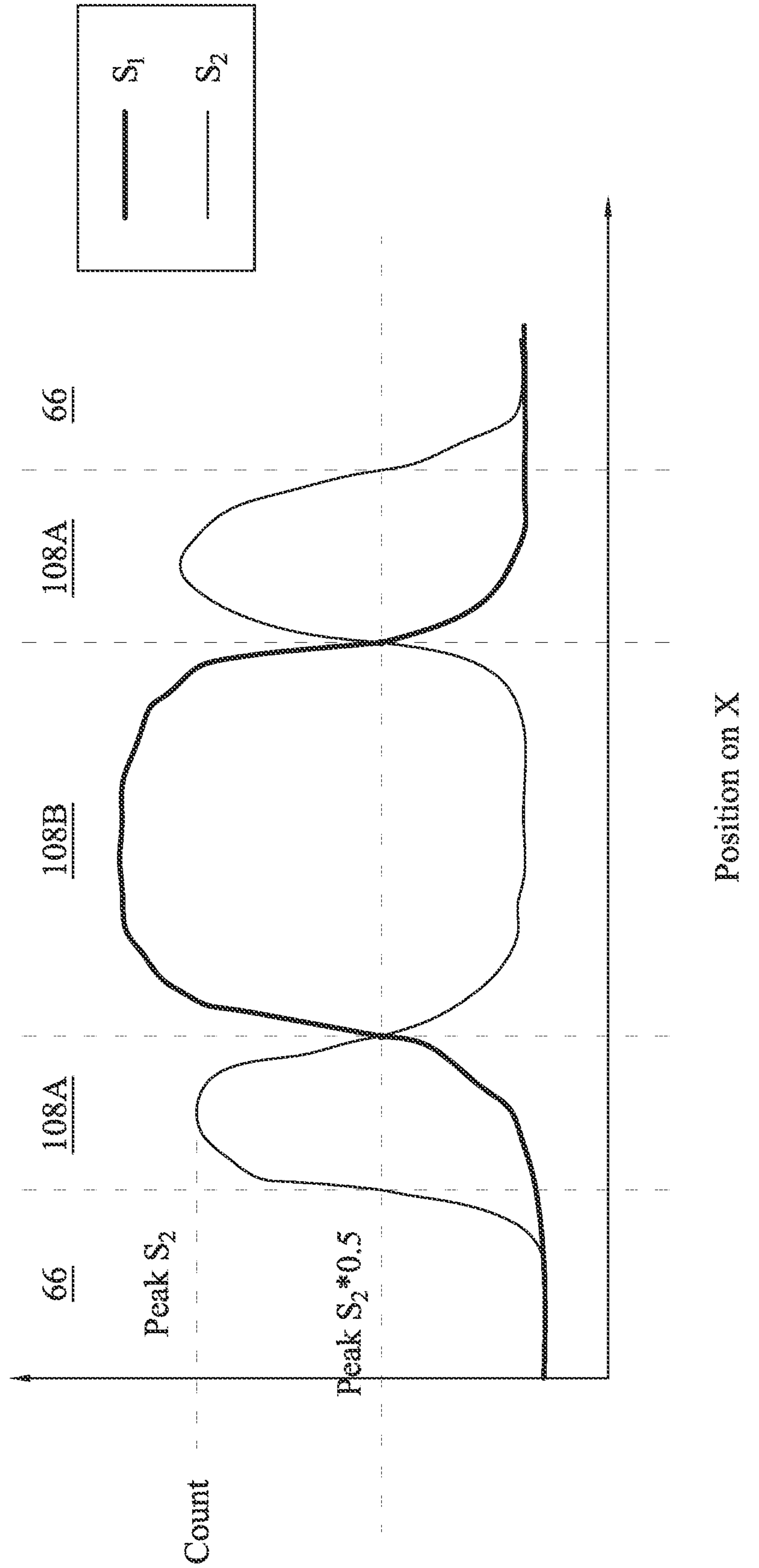
FIG. 18 illustrates the distribution of dopant species in a source/drain region, in accordance with some embodiments.

The main layers 108B may be doped with different dopants from the liner layers 108A and may be doped to different impurity concentrations than the liner layers 108A. As an example, FIG. 18 illustrates the distribution of a first dopant species $S_1$ (e.g., phosphorus when the main layer 108B comprises silicon phosphide) and a second dopant species $S_2$ (e.g., arsenic when the liner layers 108A comprise silicon arsenide) in the liner layers 108A and the main layer 108B. The X-axis represents the position along arrow 202 in FIG. 15B. The Y-axis represents the relative count of the first dopant species $S_1$ and the second dopant species $S_2$. The positions of nanostructures 66, liner layers 108A, and main layer 108B are marked. In the embodiment of FIG. 18, the concentration of the second dopant species $S_2$ is greater in the liner layers 108A that the concentration of the first dopant species $S_1$, and the concentration of the first dopant species $S_1$ is greater in the main layer 108B that the concentration of the second dopant species $S_2$. Additionally, the concentration of the first dopant species $S_1$ (e.g., phosphorus) in the liner layers 108A is less than the concentration of the first dopant species $S_1$ in the main layers 108B, and the concentration of the second dopant species $S_2$ (e.g., arsenic) in the main layers 108B is less than the concentration of the second dopant species $S_2$ in the liner layers 108A.

The interfaces between the liner layers 108A and the main layer 108B may be identified as where the relative count of the second dopant species $S_2$ drops to 50 percent of its peak value, indicating that the peak concentration of the second dopant species $S_2$ in the main layer 108B is 50 percent or less of the peak concentration of the second dopant species $S_2$ in the liner layer 108A. In some embodiments, the main layers 108B are formed of silicon phosphide (SiP). The dopant concentration of phosphorus may be greater than $1.0\times10^{21}/cm^3$, such as in a range of $1.0\times10^{21}/cm^3$ to $4.0\times10^{21}/cm^3$, which is advantageous for reducing resistance but may be disadvantageous by increasing junction leakage of phosphorus from the main layers 108B into the channel regions 68. The increasing junction leakage of phosphorus may be reduced or prevented by the dopant concentration of phosphorus in the liner layers 108A being lower than the dopant concentration of phosphorus in the main layer 108B or by using a different dopant species (e.g., arsenic) in the liner layers 108A.

In some embodiments, the main layers 108B are doped with the same dopants as the liner layers 108A but are doped to different impurity concentrations than the liner layers 108A. For example, the liner layers 108A and the main layers 108B may both be doped with phosphorus, where the concentration of phosphorus in the main layers 108B is greater than the concentration of phosphorus in the liner layers 108A. In some embodiments, the dopant concentration of phosphorus in the main layers 108B is greater than $1.0\times10^{21}/cm^3$ and the dopant concentration of phosphorus in the liner layers 108A is less than $1.0\times10^{21}/cm^3$.

In some embodiments, the epitaxial growth of the main layers 108B is performed using Chemical Vapor Deposition (CVD), Molecular beam epitaxy (MBE), Reduced pressure Chemical Vapor Deposition (RPCVD), Plasma Enhanced Chemical Vapor Deposition (PECVD), or the like. The main layers 108B may be grown from the liner layers 108A by exposing the liner layers 108A to a semiconductor-containing precursor, a dopant-containing precursor, and an etchant-containing precursor. The semiconductor-containing precursor may be a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. In some embodiments, the main layers 108B are epitaxially grown with a different silicon-containing precursor (e.g., silane) than the silicon-containing precursor (e.g., DCS) used for the epitaxial growth of the liner layers 108A. The etchant-containing precursor may be a chlorine-containing precursor such as hydrochloric acid (HCl) or the like. When the dopant is phosphorous, the dopant-containing precursor may be a phosphorous-containing precursor such as phosphine ($PH_3$), diphosphine ($P_2H_6$), phosphorus trichloride ($PCl_3$), or the like. In some embodiments, the main layers 108B are epitaxially grown with a flow rate of the semiconductor-containing precursor in a range of 20 sccm to 1100 sccm and with a flow rate of the etchant-containing precursor in a range of 0 sccm to 500 sccm. When the dopant of the main layers 108B is phosphorus, in some embodiments, the main layers 108B are epitaxially grown with a flow rate of phosphine ($PH_3$), diphosphine ($P_2H_6$), phosphorus trichloride ($PCl_3$), or the like in a range of 50 sccm to 500 sccm.

In FIG. 15C, finishing layers 108C (also referred to as third epitaxial layers) are formed on the main layers 108B. In some embodiments, the epitaxial growth of the finishing layers 108C is performed using Chemical Vapor Deposition (CVD), Molecular beam epitaxy (MBE), Reduced pressure Chemical Vapor Deposition (RPCVD), Plasma Enhanced Chemical Vapor Deposition (PECVD), or the like. The finishing layers 108C may be grown from the main layers 108B by exposing the main layers 108B to a semiconductor-containing precursor, a dopant-containing precursor, and an etchant-containing precursor. The semiconductor-containing precursor may be a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. When the dopant is phosphorous, the dopant-containing precursor may be a phosphorous-containing precursor such as phosphine ($PH_3$), diphosphine ($P_2H_6$), phosphorus trichloride ($PCl_3$), or the like. In some embodiments, the finishing layers 108C may have a greater concentration of impurities than the liner layers 108A and a lesser concentration of impurities than the main layers 108B. Although FIG. 15C illustrates liner layers 108A, main layers 108B, and finishing layers 108C, any number of semiconductor material layers may be used for the epitaxial source/drain regions 108.

In the above-discussed example, n-type source/drain regions are discussed as an example. The concept may also be applied to p-type source/drain regions. The details of p-type source/drain regions are similar to that of the n-type source/drain regions, except that phosphorous may be replaced with boron, and silicon arsenide or silicon phosphide may be replaced with boron doped silicon germanium or silicon boride.

Figure 19A:
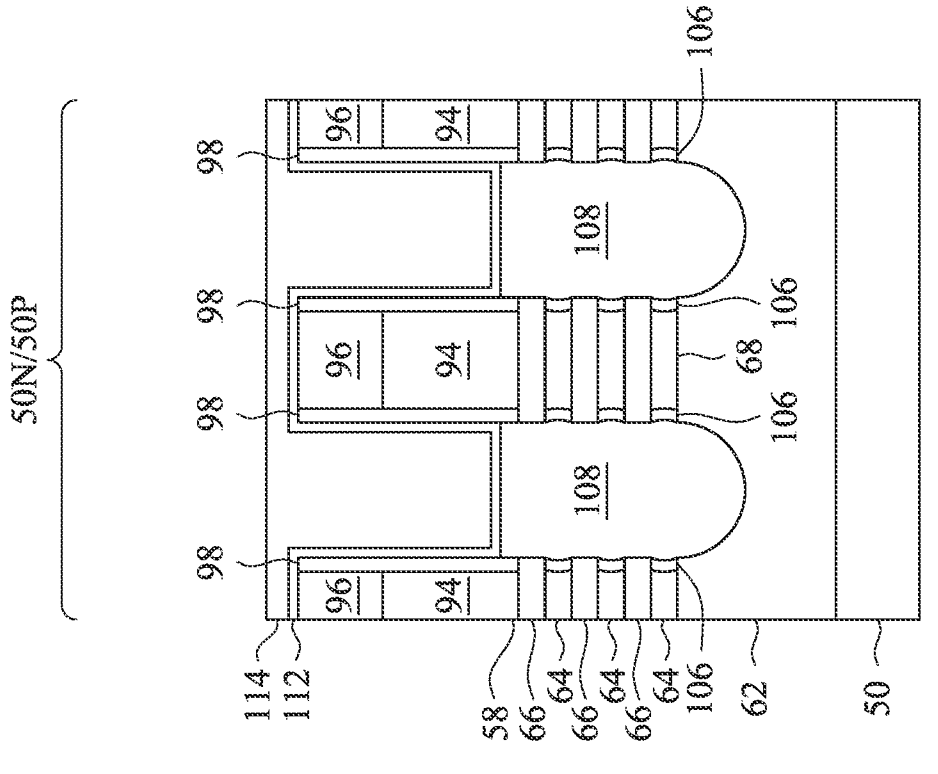
Figure 19C:
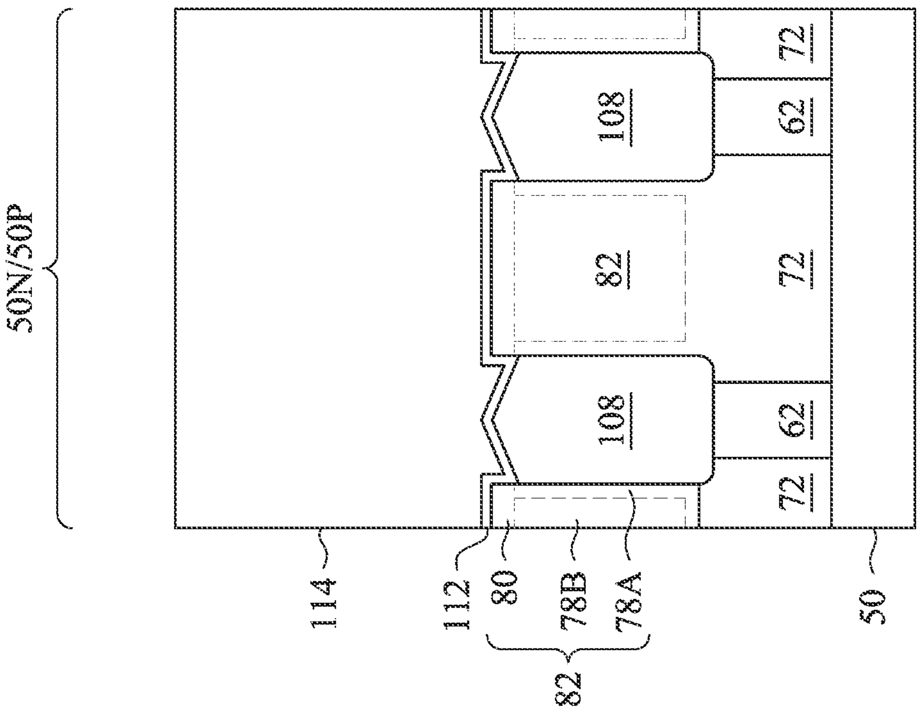
Figure 19B:
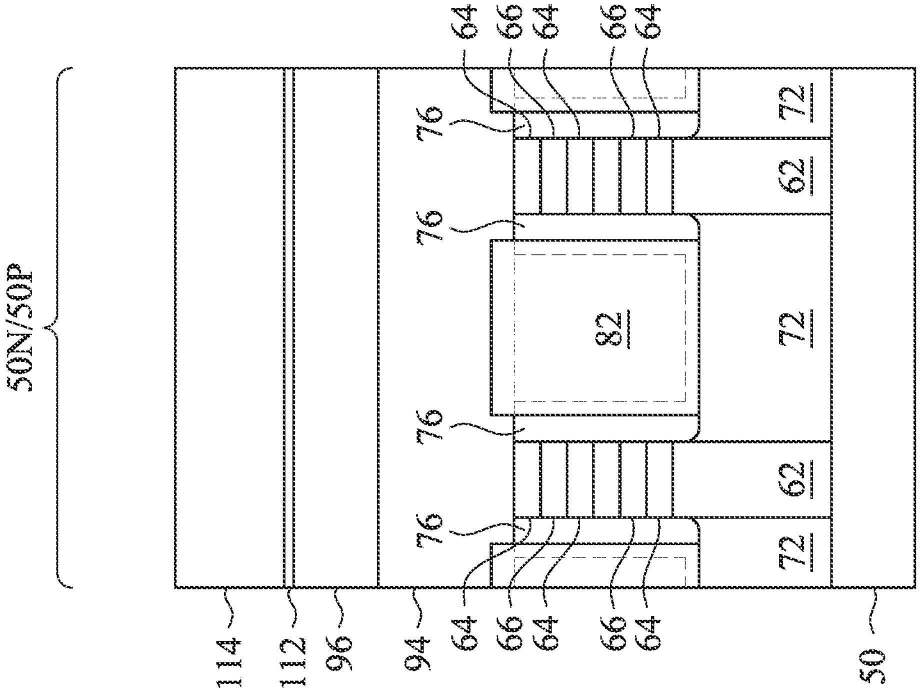

In FIGS. 19A-C, a first inter-layer dielectric (ILD) 114 is deposited over the epitaxial source/drain regions 108, the gate spacers 98, the masks 96 (if present) or the dummy gates 94. The first ILD 114 is formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 108, the gate spacers 98, and the masks 96 (if present) or the dummy gates 94. The CESL 112 may be formed of a dielectric material, such as silicon nitride, silicon oxide, silicon oxynitride, or the like, having a high etching selectivity from the etching of the first ILD 114. The CESL 112 may be formed by any suitable method, such as CVD, ALD, or the like.

Figure 20A:
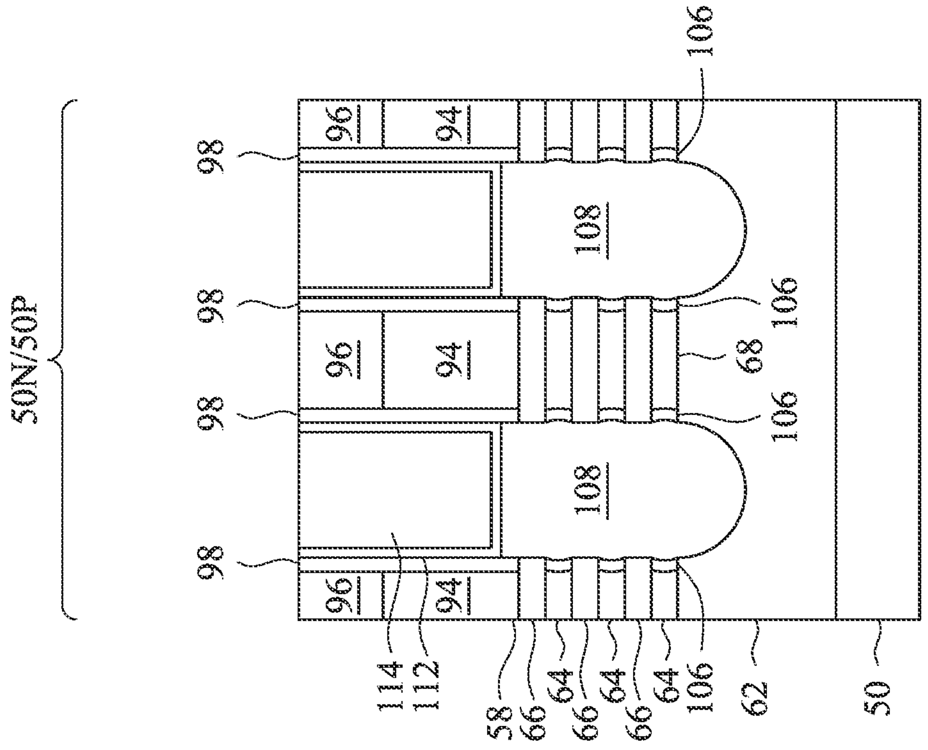
Figure 20C:
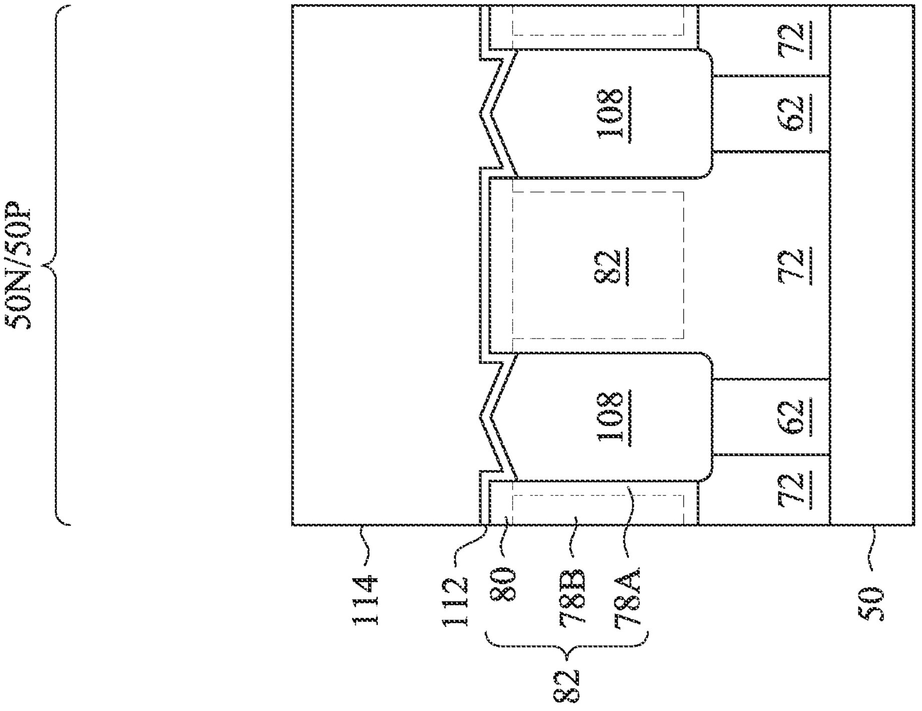
Figure 20B:
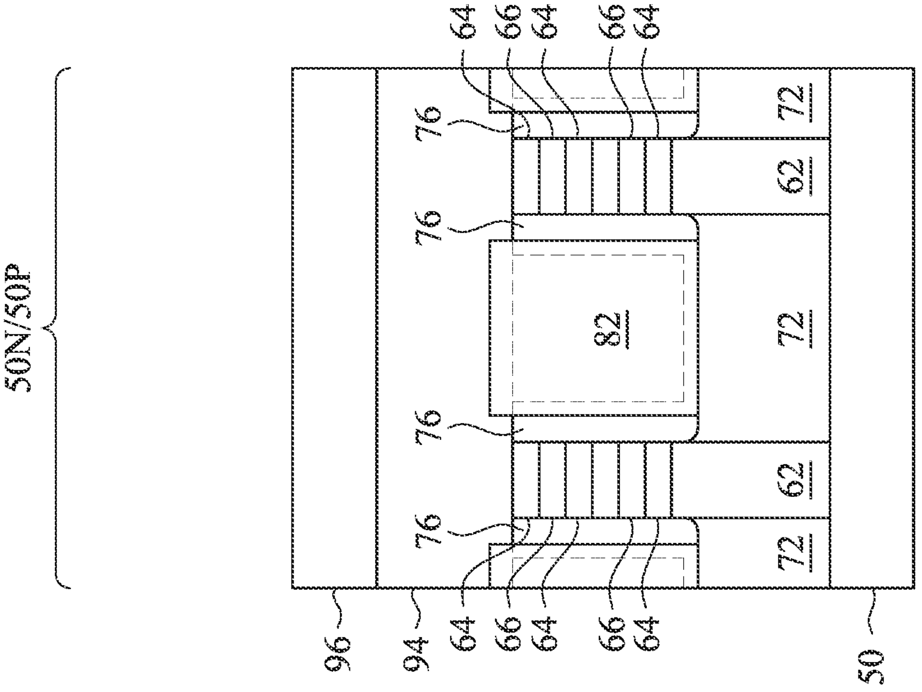

In FIGS. 20A-C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 (if present) on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 21A:
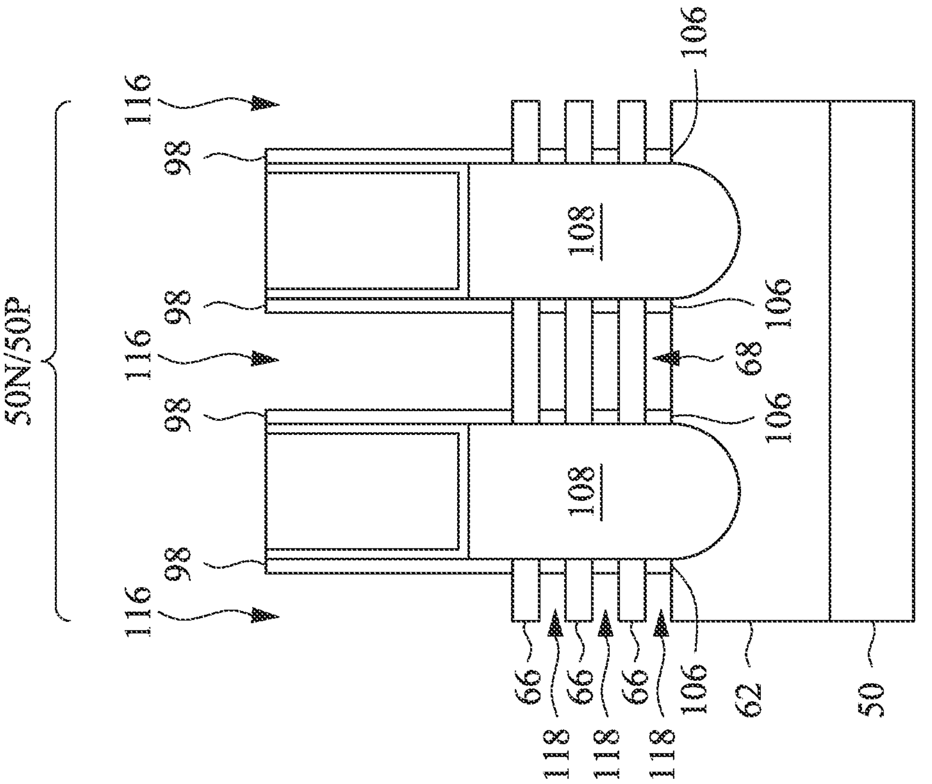
Figure 21C:
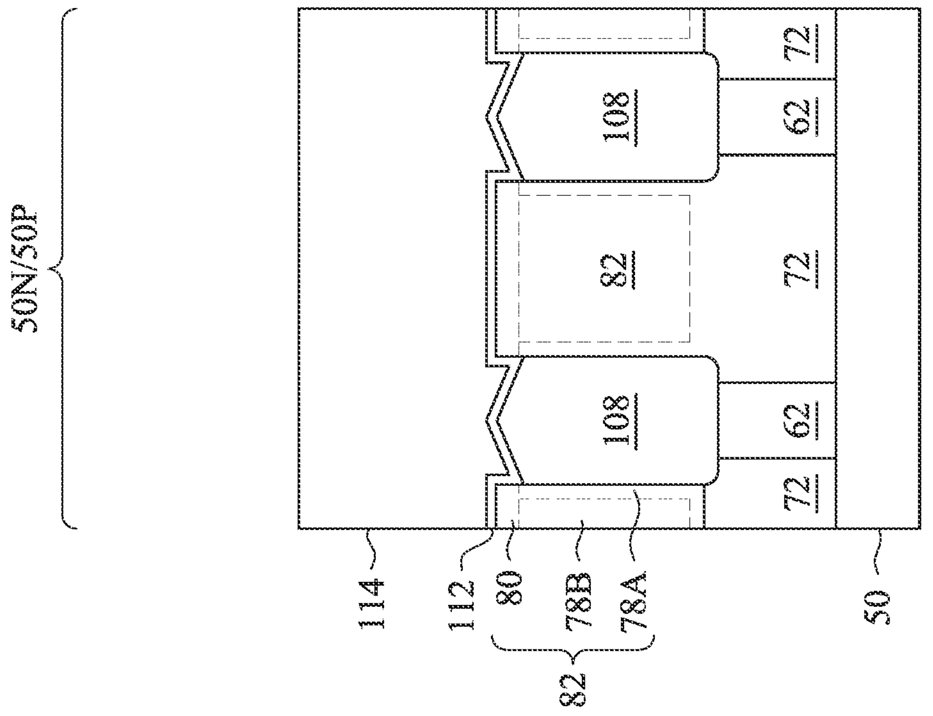
Figure 21B:
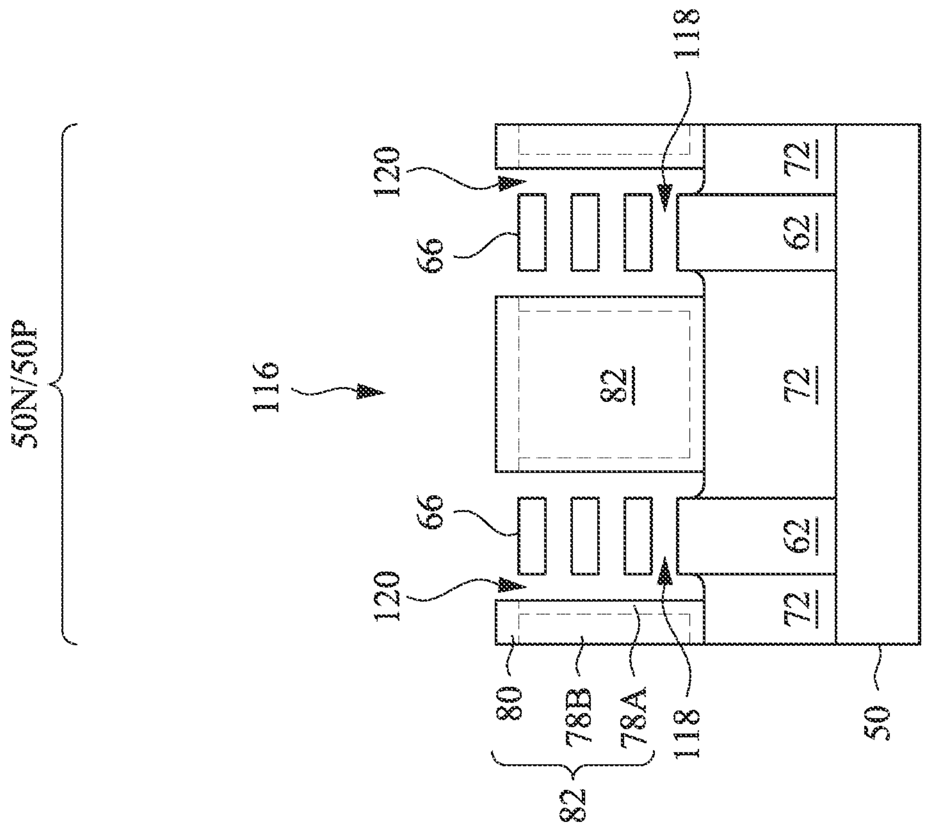

In FIGS. 21A-C, the masks 96 (if present) and the dummy gates 94 are removed in an etching process, so that recesses 116 are formed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. Each recess 116 exposes and/or overlies portions of the channel regions 68. Portions of the nanostructures 66 which act as the channel regions 68 are disposed between adjacent pairs of the epitaxial source/drain regions 108.

The remaining portions of the nanostructures 64 are then removed to expand the recesses 116, such that openings 118 are formed in regions between the nanostructures 66. The remaining portions of the sacrificial spacers 76 are also removed to expand the recesses 116, such that openings 120 are formed in regions between semiconductor fins 62 and the insulating fins 82. The remaining portions of the nanostructures 64 and the sacrificial spacers 76 can be removed by any acceptable etching process that selectively etches the material(s) of the nanostructures 64 and the sacrificial spacers 76 at a faster rate than the material of the nanostructures 66. The etching may be isotropic. For example, when the nanostructures 64 and the sacrificial spacers 76 are formed of silicon germanium and the nanostructures 66 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the nanostructures 66.

Figure 22A:
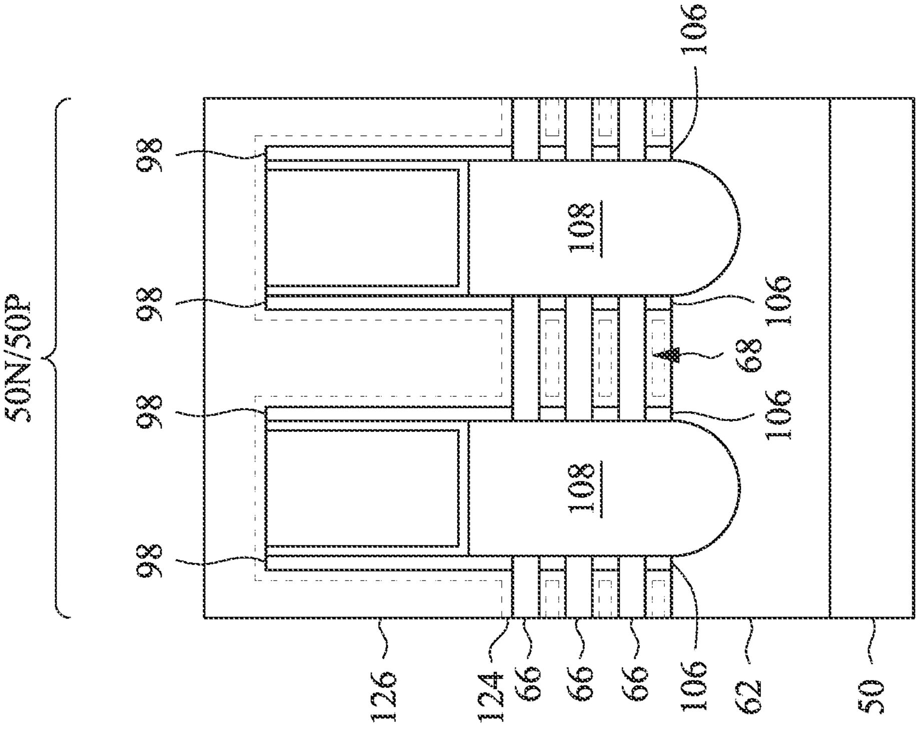
Figure 22C:
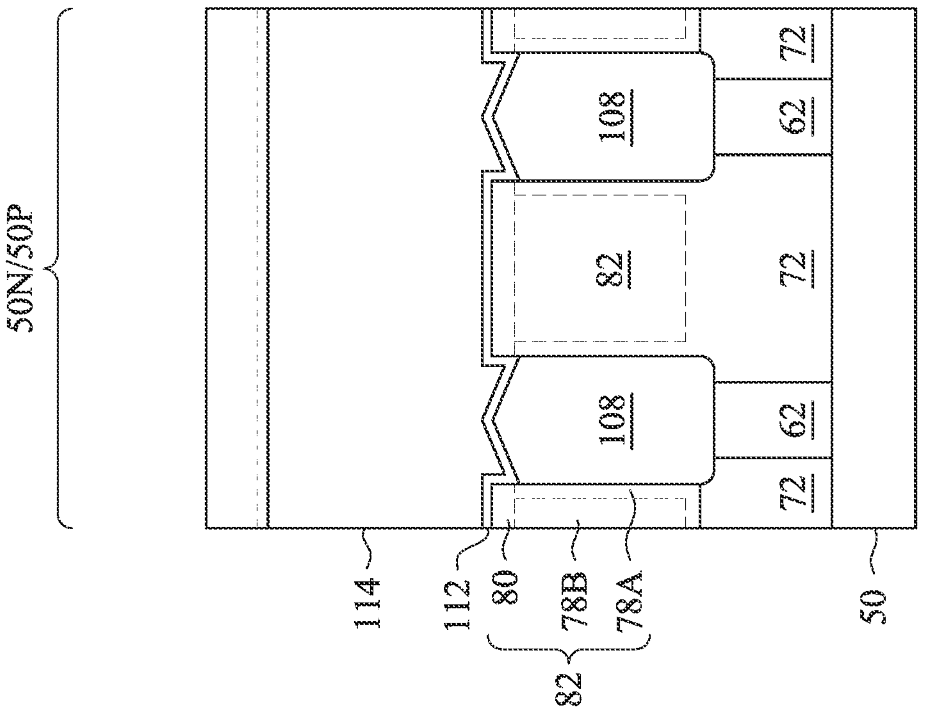
Figure 22B:
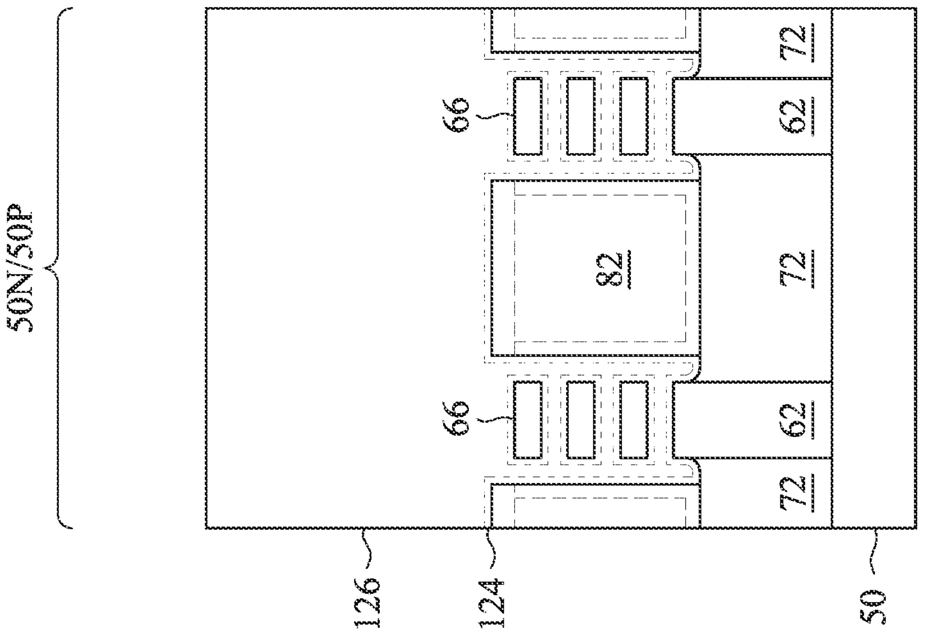

In FIGS. 22A-C, a gate dielectric layer 124 is formed in the recesses 116. A gate electrode layer 126 is formed on the gate dielectric layer 124. The gate dielectric layer 124 and the gate electrode layer 126 are layers for replacement gates, and each wrap around all (e.g., four) sides of the nanostructures 66. Thus, the gate dielectric layer 124 and the gate electrode layer 126 are formed in the openings 118 and the openings 120 (see FIGS. 21A-C).

The gate dielectric layer 124 is disposed on the sidewalls and/or the top surfaces of the semiconductor fins 62; on the top surfaces, the sidewalls, and the bottom surfaces of the nanostructures 66; on the sidewalls of the inner spacers 106 adjacent the epitaxial source/drain regions 108 and the gate spacers 98 on top surfaces of the top inner spacers 106; and on the top surfaces and the sidewalls of the insulating fins 82. The gate dielectric layer 124 may also be formed on the top surfaces of the first ILD 114 and the gate spacers 98. The gate dielectric layer 124 may include an oxide such as silicon oxide or a metal oxide, a silicate such as a metal silicate, combinations thereof, multi-layers thereof, or the like. The gate dielectric layer 124 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. Although a single-layered gate dielectric layer 124 is illustrated in FIGS. 22A-C, the gate dielectric layer 124 may include any number of interfacial layers and any number of main layers.

The gate electrode layer 126 may include a metal-containing material such as titanium nitride, titanium oxide, tungsten, cobalt, ruthenium, aluminum, combinations thereof, multi-layers thereof, or the like. Although a single-layered gate electrode layer 126 is illustrated in FIGS. 22A-C, the gate electrode layer 126 may include any number of work function tuning layers, any number of barrier layers, any number of glue layers, and a fill material.

The formation of the gate dielectric layers 124 in the n-type region 50N and the p-type region 50P may occur simultaneously such that the gate dielectric layers 124 in each region are formed of the same materials, and the formation of the gate electrode layers 126 may occur simultaneously such that the gate electrode layers 126 in each region are formed of the same materials. In some embodiments, the gate dielectric layers 124 in each region may be formed by distinct processes, such that the gate dielectric layers 124 may be different materials and/or have a different number of layers, and/or the gate electrode layers 126 in each region may be formed by distinct processes, such that the gate electrode layers 126 may be different materials and/or have a different number of layers. Various masking steps may be used to mask and expose appropriate regions when using distinct processes.

Figure 23A:
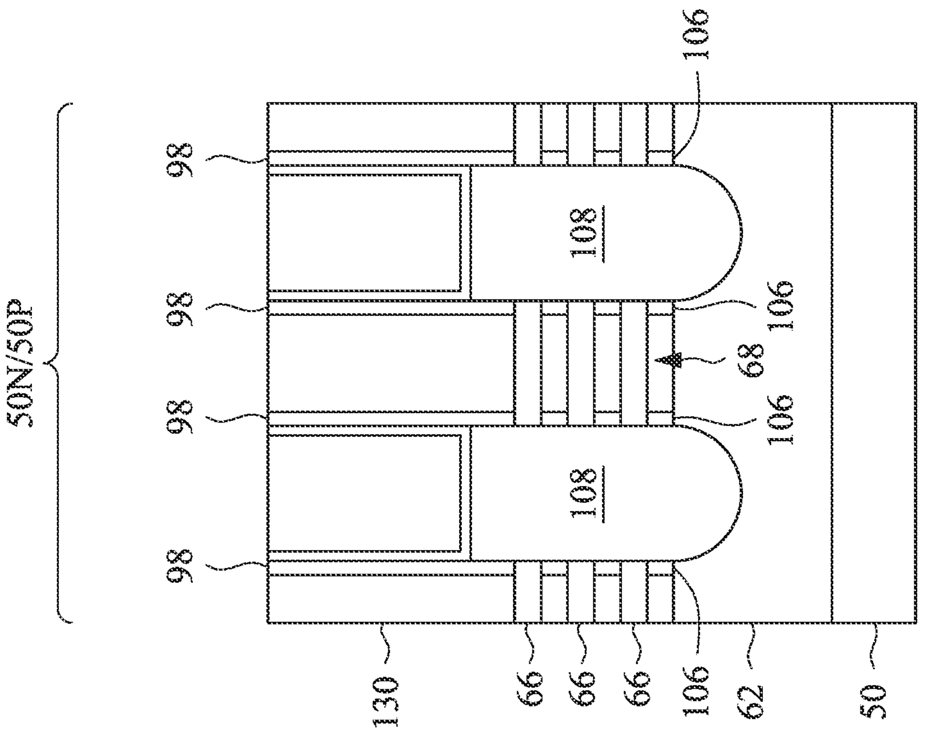
Figure 23C:
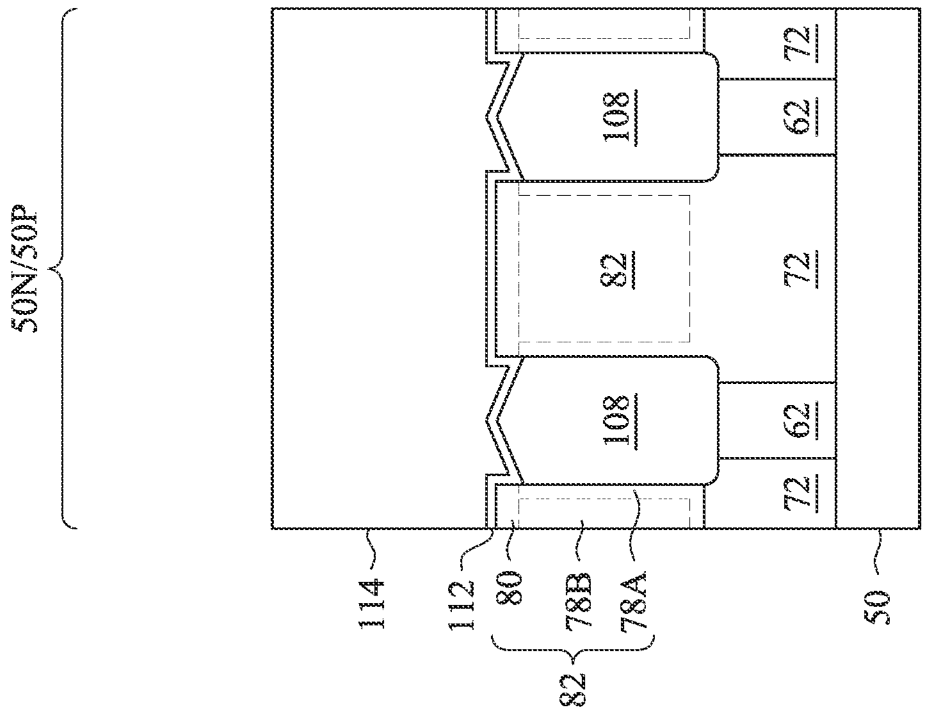
Figure 23B:
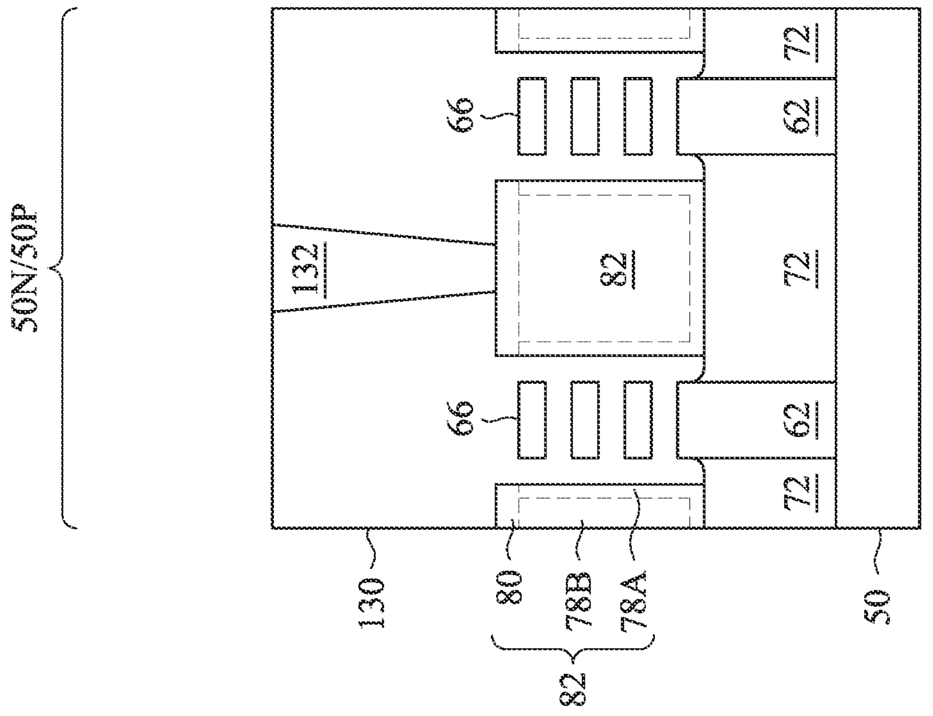

In FIGS. 23A-C, a removal process is performed to remove the excess portions of the materials of the gate dielectric layer 124 and the gate electrode layer 126, which excess portions are over the top surfaces of the first ILD 114 and the gate spacers 98, thereby forming gate structures 130. In some embodiments, a planarization process such as a chemical mechanical polish (CMP), an etch-back process, combinations thereof, or the like may be utilized. The gate dielectric layer 124, when planarized, has portions left in the recesses 116 (thus forming gate dielectrics for the gate structures 130). The gate electrode layer 126, when planarized, has portions left in the recesses 116 (thus forming gate electrodes for the gate structures 130). The top surfaces of the gate spacers 98, the CESL 112, the first ILD 114, and the gate structures 130 are coplanar (within process variations). The gate structures 130 are replacement gates of the resulting nano-FETs, and may be referred to as "metal gates." The gate structures 130 each extend along top surfaces, sidewalls, and bottom surfaces of a channel region 68 of the nanostructures 66. The gate structures 130 fill the area previously occupied by the nanostructures 64, the sacrificial spacers 76, and the dummy gates 94.

In some embodiments, isolation regions 132 are formed extending through some of the gate structures 130. An isolation region 132 is formed to divide (or "cut") a gate structure 130 into multiple gate structures 130. The isolation region 132 may be formed of a dielectric material, such as silicon nitride, silicon oxide, silicon oxynitride, or the like, which may be formed by a deposition process such as CVD, ALD, or the like. As an example to form the isolation regions 132, openings can be patterned in the desired gate structures 130. Any acceptable etch process, such as a dry etch, a wet etch, the like, or a combination thereof, may be performed to pattern the openings. The etching may be anisotropic. One or more layers of dielectric material may be deposited in the openings. A removal process may be performed to remove the excess portions of the dielectric material, which excess portions are over the top surfaces of the gate structures 130, thereby forming the isolation regions 132.

Figure 24A:
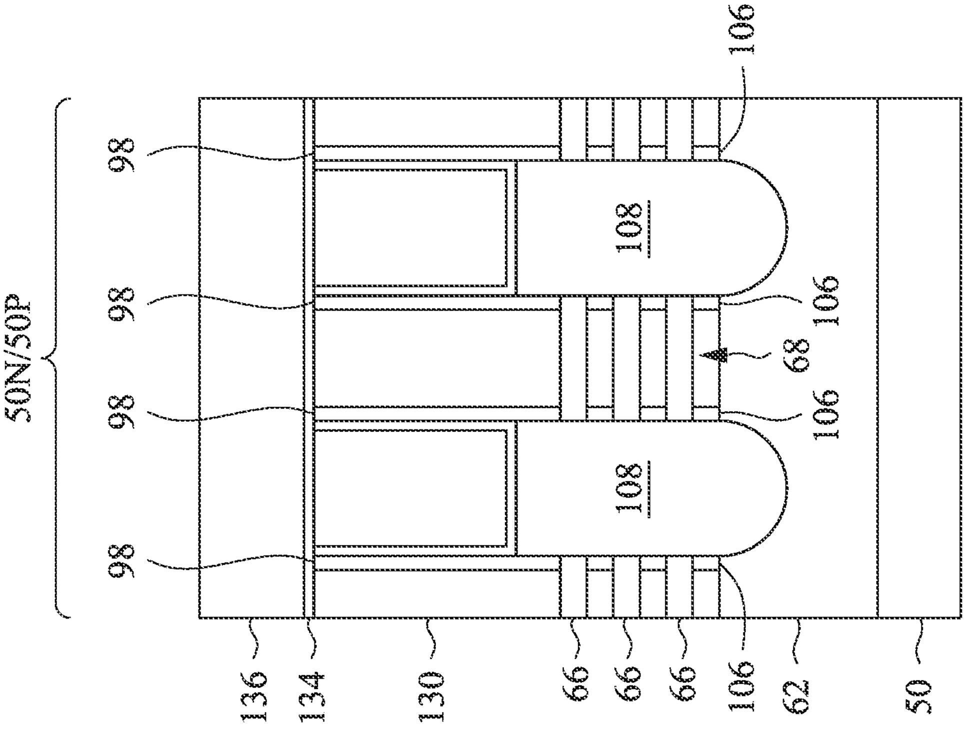
Figure 24C:
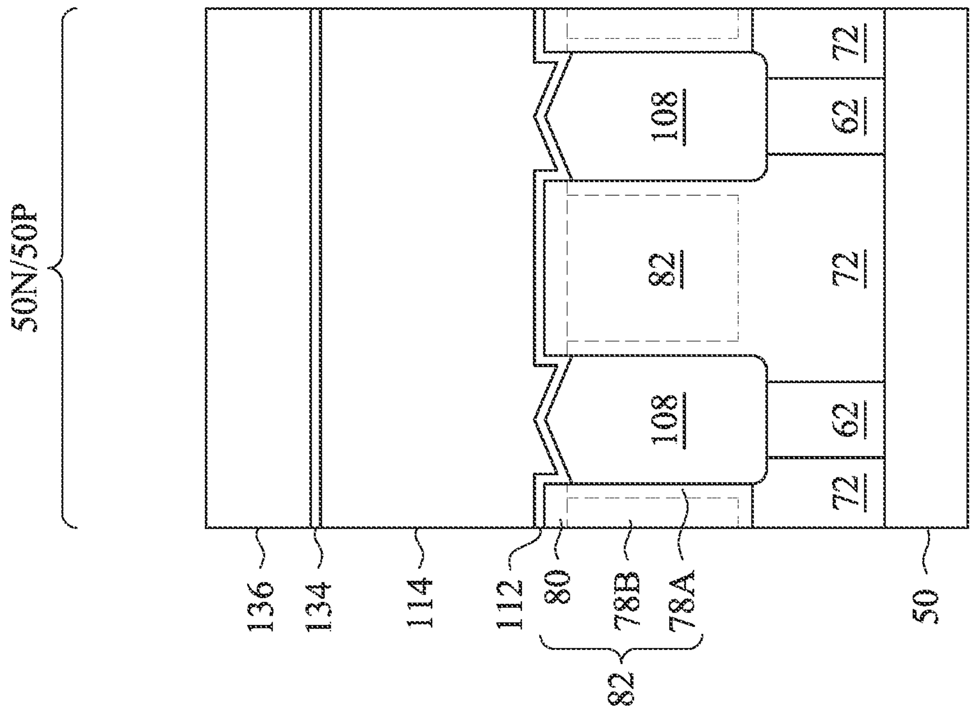
Figure 24B:
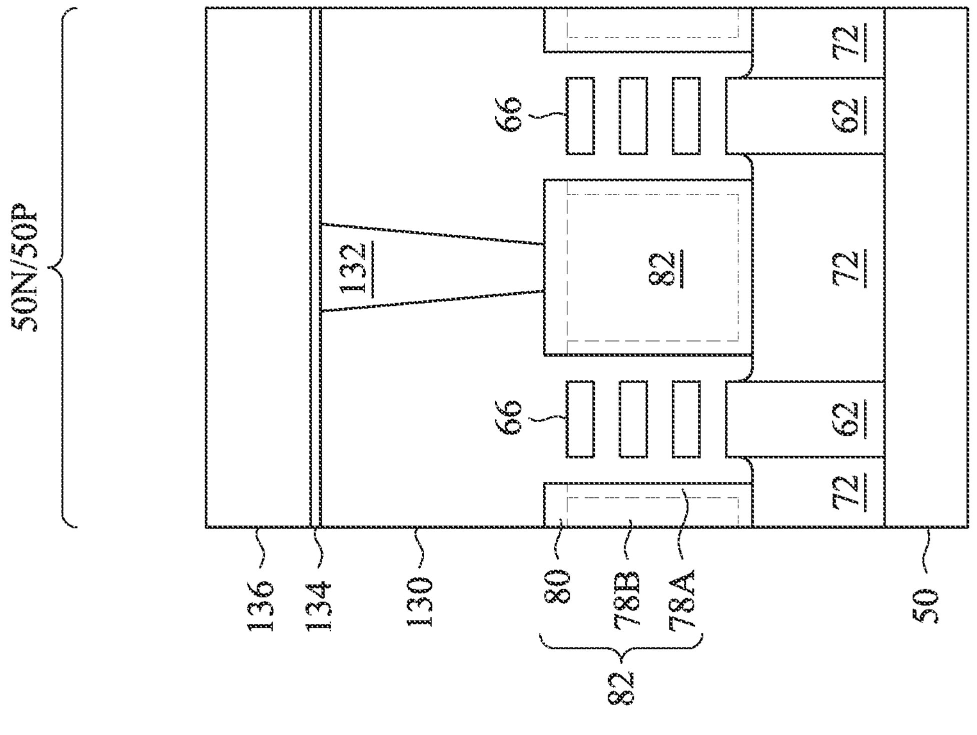

In FIGS. 24A-C, a second ILD 136 is deposited over the gate spacers 98 98, the CESL 112, the first ILD 114, and the gate structures 130. In some embodiments, the second ILD 136 is a flowable film formed by a flowable CVD method. In some embodiments, the second ILD 136 is formed of a dielectric material such as PSG, BSG, BPSG, USG, or the like, which may be deposited by any suitable method, such as CVD, PECVD, or the like.

In some embodiments, an etch stop layer (ESL) 134 is formed between the second ILD 136 and the gate spacers 98, the CESL 112, the first ILD 114, and the gate structures 130. The ESL 134 may include a dielectric material, such as silicon nitride, silicon oxide, silicon oxynitride, or the like, having a high etching selectivity from the etching of the second ILD 136.

Figure 25A:
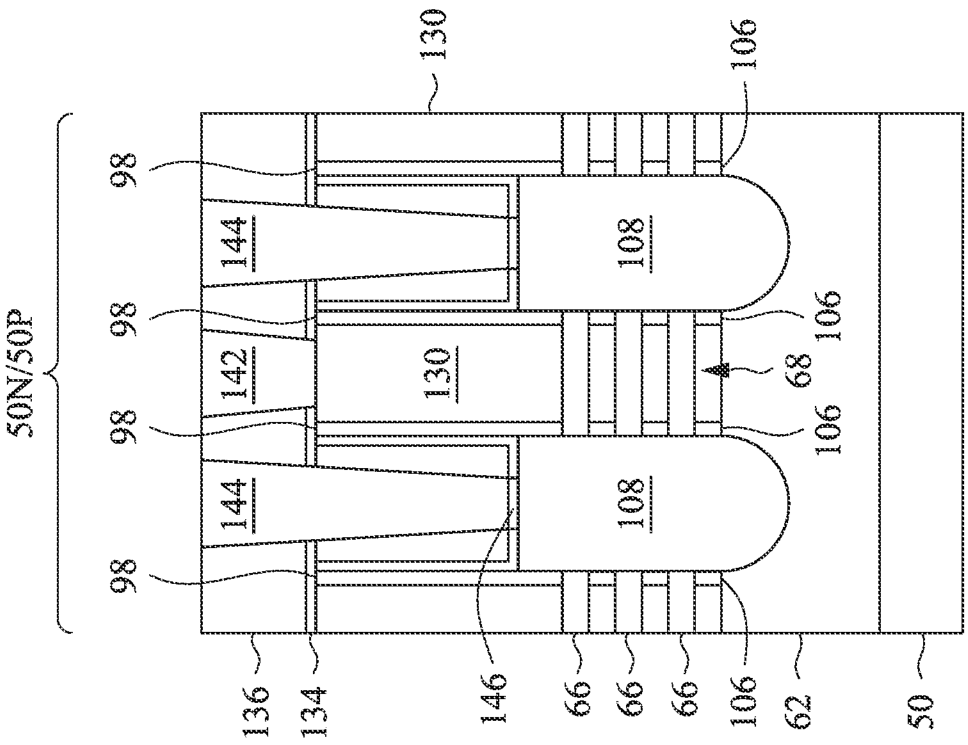
Figure 25C:
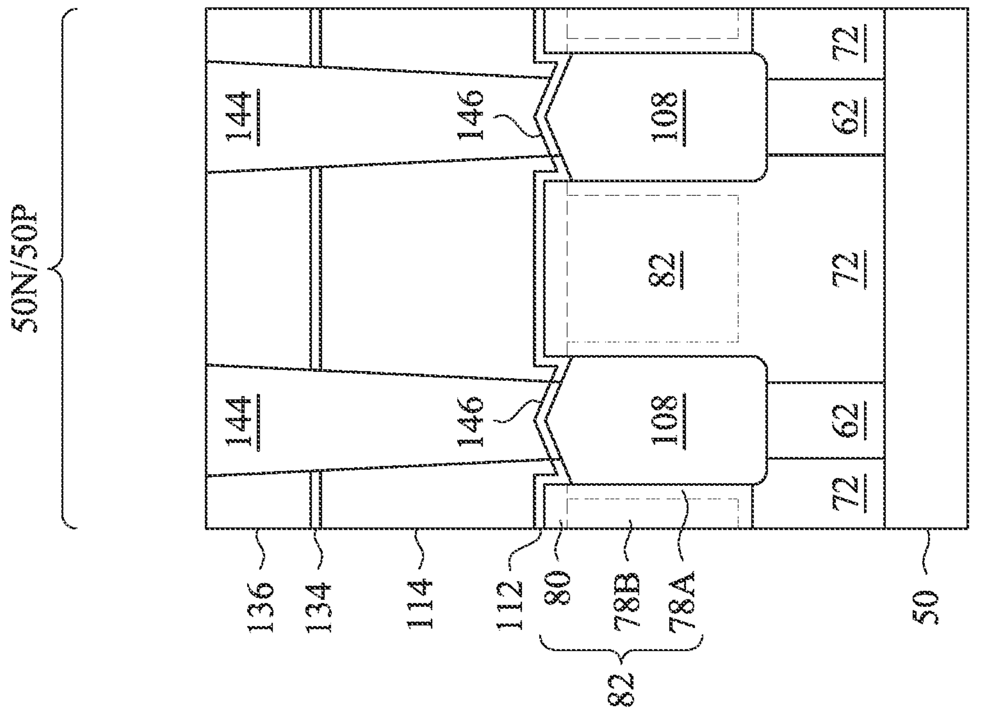
Figure 25B:
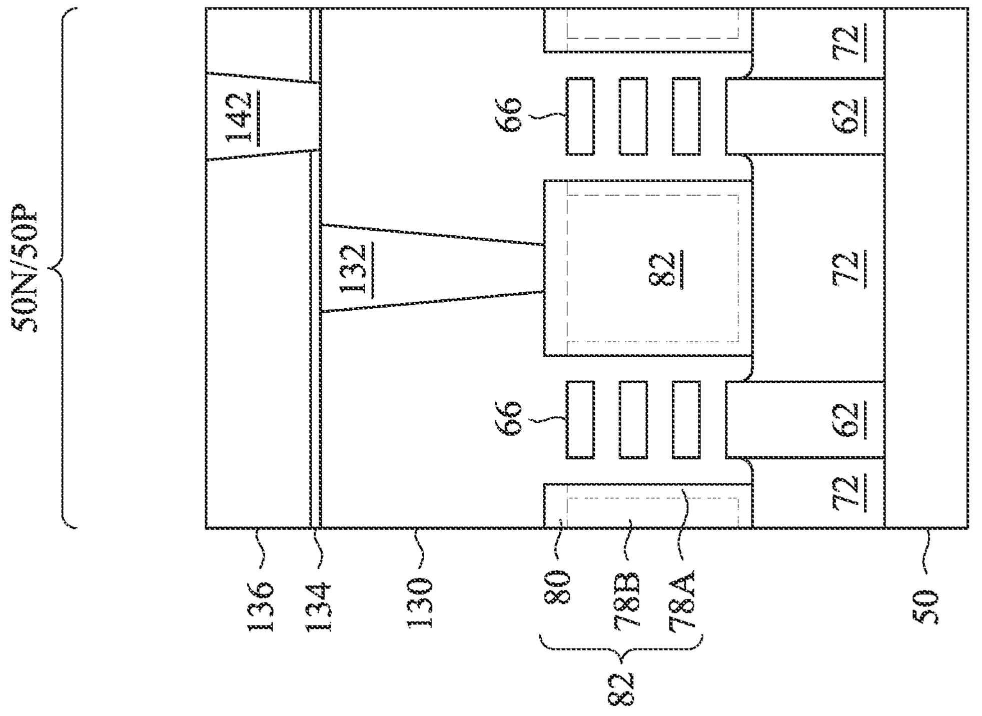

In FIGS. 25A-C, gate contacts 142 and source/drain contacts 144 are formed to contact, respectively, the gate structures 130 and the epitaxial source/drain regions 108. The gate contacts 142 are physically and electrically coupled to the gate structures 130. The source/drain contacts 144 are physically and electrically coupled to the epitaxial source/drain regions 108.

As an example to form the gate contacts 142 and the source/drain contacts 144, openings for the gate contacts 142 are formed through the second ILD 136 and the ESL 134, and openings for the source/drain contacts 144 are formed through the second ILD 136, the ESL 134, the first ILD 114, and the CESL 112. The openings may be formed using acceptable photolithography and etching techniques.

A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 136. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 108 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Figure 27:
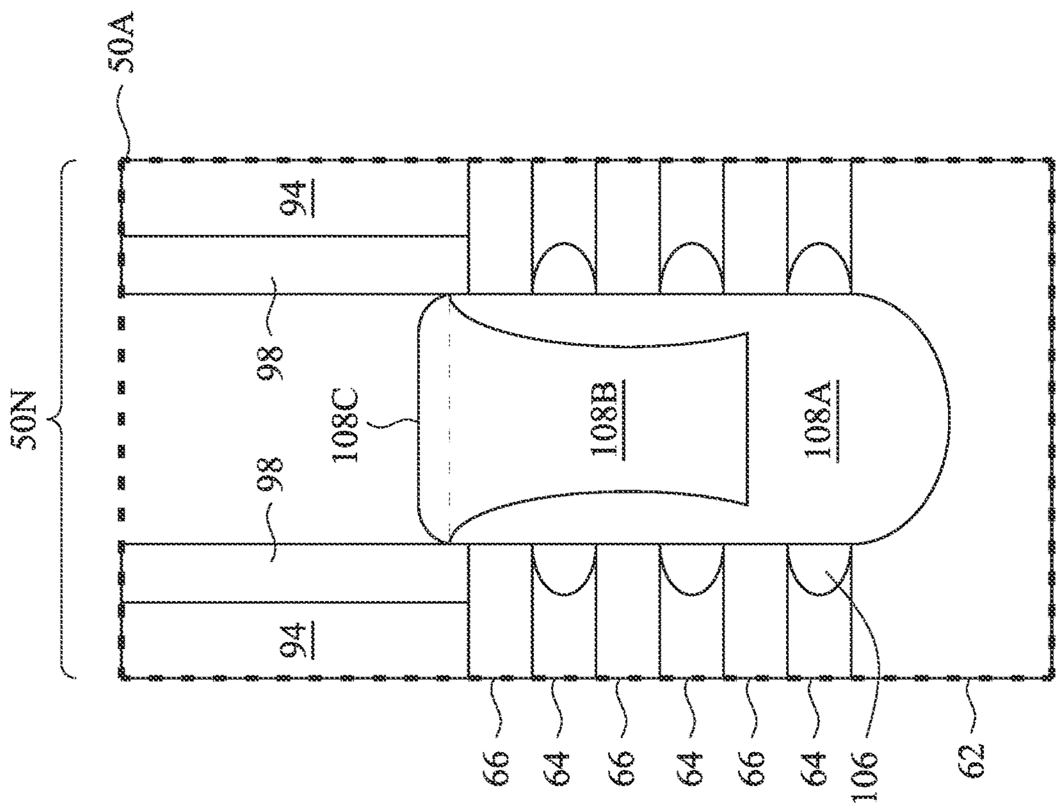
FIGS. 26 and 27 are cross-sectional views of intermediate stages in the manufacturing of nano-FETs, in accordance with some other embodiments.
Figure 26:
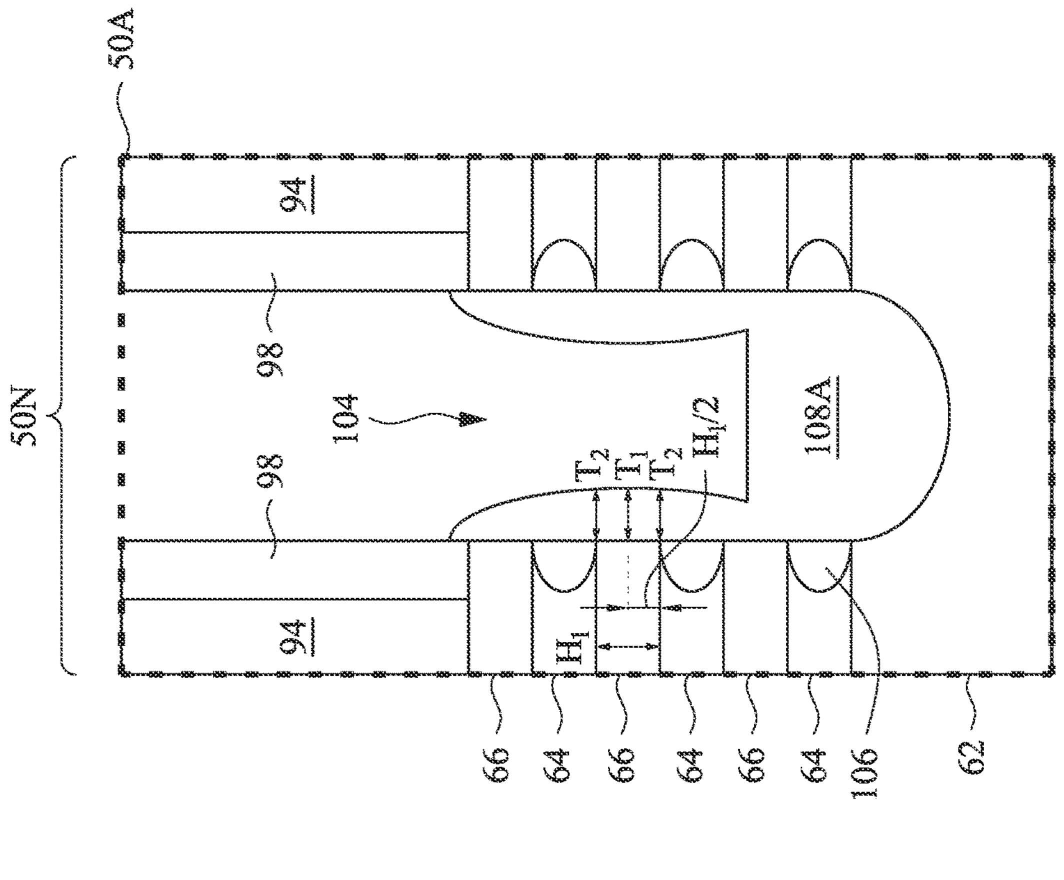

FIGS. 26-27 illustrate a process for forming the epitaxial source/drain regions 108 in the n-type region 50N, in accordance with some other embodiments. FIGS. 26-27 are detailed views of features in a region 50A in FIG. 14A. This embodiment is similar to the embodiment described for FIGS. 15A-15C, except the liner layers 108A are conformal on sidewalls of the source/drain recesses 104.

In FIG. 26, the liner layers 108A are formed in the source/drain recesses 104 in the n-type region 50N. The liner layers 108A are conformal on sidewalls of the source/drain recesses 104 and have substantially uniform lateral thicknesses at the centers of the nanostructures 66 and at the corners of the nanostructures 66. In some embodiments, the liner layers 108A have round convex profiles in a cross-sectional view. Similar to the embodiment described above for FIGS. 15A-15C, a first thickness $T_1$ of a liner layer 108A is measured across the liner layer 108A at a midpoint of a nanostructure 66, equidistant from a top surface and a bottom surface of the nanostructure 66 by a height $H_1/2$, and second thickness $T_2$ of the liner layer 108A is measured at a point which is level with the top surface and/or the bottom surface of the nanostructure 66. In some embodiments, the first thickness $T_1$ is in a range of 2 nm to 8 nm. In some embodiments, the second thickness $T_2$ is in a range of 1.4 nm to 8 nm. In some embodiments, a ratio of the second thickness $T_2$ to the first thickness $T_1$ is in the range of 0.7 to 1.0, which as described above for FIGS. 15A-15C, is advantageous for decreasing junction leakage from subsequently formed overlying main layers 108B (see below, FIG. 27) into the nanostructures 66.

The liner layers 108A may be epitaxially grown by flowing a silicon-containing precursor (e.g., a silane) with a small proportion of a chlorine-containing precursor (e.g., HCl). The liner layers 108A may be formed of similar materials as the liner layers 108A as described above with respect to FIG. 15A, and may be grown with a low flow rate of the chlorine-containing precursor. In some embodiments, the liner layers 108A are formed with a silicon-containing precursor flow rate in a range of 20 sccm to 1100 sccm, a chlorine-containing precursor flow rate in a range of 0 sccm to 500 sccm, and a ratio of the flow rate of the silicon-containing precursor to the flow rate of the chlorine-containing precursor in a range of 10 to 15.

The low flow rate of the chlorine-containing precursor reduces chlorine passivation on exposed surfaces of the nanostructures 66 with (111) orientation and increases the (111) growth rate of liner layers 108A on exposed surfaces of the nanostructures 66. For example, portions of liner layers 108A may first be formed on exposed surfaces of the nanostructures 66 as a seeding layer for subsequent conformal growth of the liner layers 108A over the inner spacers 106, leading to the liner layers 108A being conformal on sidewalls of the source/drain recesses 104.

In FIG. 27, the main layers 108B are formed on the liner layers 108A and the finishing layers 108C are formed on the main layers 108B. The main layers 108B and the finishing layers 108C may be formed of similar materials and by similar methods as described above with respect to FIGS. 15B-15C. The increased thickness of the liner layers 108A over the corners of the nanostructures 66 may reduce junction leakage from subsequently formed main layers 108B into the nanostructures 66, providing better DIBL control and increasing device performance. Subsequent processing steps may be performed as described with respect to FIGS. 19A-25C to form a similar structure as illustrated above in FIGS. 25A-25C.

Embodiments may achieve advantages. For example, in some embodiments, epitaxial layers with low concentrations of a dopant are formed on exposed surfaces of nanostructures to have a large thickness on the corners of the nanostructures. The epitaxial layers may be formed with round convex profiles or substantially uniform thicknesses over sidewalls of the nanostructures by performing epitaxial growth with low flow rates of a chlorine-containing precursor. The increased thicknesses of the epitaxial layers over the corners of the nanostructures reduce junction leakage of dopants from subsequently formed epitaxial layers into channel regions of the nanostructures, which controls DIBL and improves device performance.

In accordance with an embodiment, a device includes: a first nanostructure over a substrate, the first nanostructure including a first channel region; and a first source/drain region adjacent the first nanostructure, the first source/drain region including: a first epitaxial layer covering a first sidewall of the first nanostructure, the first epitaxial layer having a first concentration of a first dopant, the first epitaxial layer having a round convex profile opposite the first sidewall of the first nanostructure in a cross-sectional view; and a second epitaxial layer covering the round convex profile of the first epitaxial layer in the cross-sectional view, the second epitaxial layer having a second concentration of the first dopant, the second concentration being different from the first concentration. In an embodiment, the first dopant is phosphorus and the second concentration is greater than the first concentration. In an embodiment, the first dopant is arsenic and the second concentration is less than the first concentration. In an embodiment, the first concentration is in a range of $5\times10^{19}$ atoms/cm$^3$ to $1.5\times10^{21}$ atoms/cm$^3$. In an embodiment, the first epitaxial layer has a third concentration of phosphorus, the second epitaxial layer has a fourth concentration of phosphorus, and the third concentration is less than the fourth concentration. In an embodiment, the device further includes an inner spacer between the first nanostructure and the substrate, where the first epitaxial layer extends over a first portion of a sidewall of the inner spacer. In an embodiment, the second epitaxial layer covers a second portion of the sidewall of the inner spacer, the second portion being below the first portion. In an embodiment, the first epitaxial layer has a first thickness measured across the first epitaxial layer at a midpoint of the first nanostructure, the first epitaxial layer has a second thickness measured across the first epitaxial layer at a point level with a top surface of the first nanostructure, and a ratio of the second thickness to the first thickness is in a range of 0.7 to 1.0.

In accordance with another embodiment, a device includes: a first nanostructure over a substrate; a second nanostructure over the substrate; and a first source/drain region between the first nanostructure and the second nanostructure, the first source/drain region including: a first epitaxial layer having a first portion and a second portion, the first portion of the first epitaxial layer covering a first sidewall of the first nanostructure, the second portion of the first epitaxial layer covering a second sidewall of the second nanostructure, the first portion of the first epitaxial layer having a first thickness measured at a midpoint of the first nanostructure, the first epitaxial layer having a second thickness measured at a point level with a top surface of the first nanostructure, a ratio of the second thickness to the first thickness being in a range of 0.7 to 1.0; and a second epitaxial layer between the first portion of the first epitaxial layer and the second portion of the first epitaxial layer. In an embodiment, the first epitaxial layer is doped with a first dopant species, the first dopant species being arsenic. In an embodiment, the first epitaxial layer has a first concentration of a second dopant species, the second epitaxial layer has a second concentration of the second dopant species, and the second concentration is greater than the first concentration. In an embodiment, the second dopant species is phosphorus. In an embodiment, the first portion of the first epitaxial layer has a round convex profile opposite the first sidewall of the first nanostructure in a cross-sectional view and the second portion of the first epitaxial layer has a round convex profile opposite the second sidewall of the second nanostructure in the cross-sectional view. In an embodiment, the first epitaxial layer has a first peak concentration of a first dopant species, the second epitaxial layer has a second peak concentration of the first dopant species, and the second peak concentration is 50 percent or less of the first peak concentration.

In accordance with yet another embodiment, a method includes: forming a first nanostructure over a substrate; etching a recess through the first nanostructure; forming a first epitaxial layer in the recess with a first silicon-containing precursor, the first epitaxial layer including a first portion on a sidewall of the first nanostructure, the first portion having a round convex profile in a cross-sectional view; and forming a second epitaxial layer over the first epitaxial layer with a second silicon-containing precursor. In an embodiment, forming the first epitaxial layer further includes flowing a chlorine-containing precursor, where a ratio of a flow rate of the first silicon-containing precursor to a flow rate of the chlorine-containing precursor is in a range of 10 to 15. In an embodiment, the first silicon-containing precursor is dichlorosilane (DCS), the second silicon-containing precursor is silane, and the chlorine-containing precursor is HCl. In an embodiment, the first epitaxial layer has a first concentration of phosphorus, the second epitaxial layer has a second concentration of phosphorus, and the second concentration is greater than the first concentration. In an embodiment, the first epitaxial layer has a first concentration of arsenic, the second epitaxial layer has a second concentration of arsenic, and the second concentration is less than the first concentration. In an embodiment, forming the first epitaxial layer further includes flowing arsine and forming the second epitaxial layer further includes flowing phosphine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
- a first nanostructure over a substrate, the first nanostructure comprising a first channel region;
- an inner spacer between the first nanostructure and the substrate; and
- a first source/drain region adjacent the first nanostructure, the first source/drain region comprising:
  - a first epitaxial layer covering a first sidewall of the first nanostructure, the first epitaxial layer having a first concentration of a first dopant, the first epitaxial layer having a round convex profile opposite the first sidewall of the first nanostructure in a cross-sectional view, wherein the first epitaxial layer has a first thickness measured across the first epitaxial layer at a midpoint of the first nanostructure, the first epitaxial layer has a second thickness measured across the first epitaxial layer at a point level with a top surface of the first nanostructure, and a ratio of the second thickness to the first thickness is in a range of 0.7 to 1.0; and
  - a second epitaxial layer covering the round convex profile of the first epitaxial layer in the cross-sectional view, the first epitaxial layer being between the second epitaxial layer and the first nanostructure, the first epitaxial layer overlapping the second epitaxial layer, the second epitaxial layer being in physical contact with the inner spacer, the second epitaxial layer having a second concentration of the first dopant, the second concentration being different from the first concentration.

2. The device of claim 1, wherein the first dopant is phosphorus and the second concentration is greater than the first concentration.

3. The device of claim 1, wherein the first dopant is arsenic and the second concentration is less than the first concentration.

4. The device of claim 3, wherein the first concentration is in a range of $5\times10^{19}$ atoms/cm$^3$ to $1.5\times10^{21}$ atoms/cm$^3$.

5. The device of claim 3, wherein the first epitaxial layer has a third concentration of phosphorus, the second epitaxial layer has a fourth concentration of phosphorus, and the third concentration is less than the fourth concentration.

6. The device of claim 1, wherein the first epitaxial layer extends over a first portion of a sidewall of the inner spacer.

7. The device of claim 6, wherein the second epitaxial layer covers a second portion of the sidewall of the inner spacer, the second portion being below the first portion.

8. A device comprising:
- a first nanostructure over a substrate;
- a second nanostructure over the first nanostructure and the substrate, wherein the first nanostructure vertically overlaps the second nanostructure; and
- a first source/drain region, the first source/drain region comprising:
  - a first epitaxial layer having a first portion and a second portion, the first portion of the first epitaxial layer covering a first sidewall of the first nanostructure, the second portion of the first epitaxial layer covering a second sidewall of the second nanostructure, the first portion of the first epitaxial layer having a first thickness measured at a midpoint of the first nanostructure, the first epitaxial layer having a second thickness measured at a point level with a top surface of the first nanostructure, a ratio of the second thickness to the first thickness being in a range of 0.7 to 1.0; and
  - a second epitaxial layer between the first portion of the first epitaxial layer and the second portion of the first epitaxial layer.

9. The device of claim 8, wherein the first epitaxial layer is doped with a first dopant species, the first dopant species being arsenic.

10. The device of claim 9, wherein the first epitaxial layer has a first concentration of a second dopant species, the second epitaxial layer has a second concentration of the second dopant species, and the second concentration is greater than the first concentration.

11. The device of claim 10, wherein the second dopant species is phosphorus.

12. The device of claim 8, wherein the first portion of the first epitaxial layer has a round convex profile opposite the first sidewall of the first nanostructure in a cross-sectional view and the second portion of the first epitaxial layer has a round convex profile opposite the second sidewall of the second nanostructure in the cross-sectional view.

13. The device of claim 8, wherein the first epitaxial layer has a first peak concentration of a first dopant species, the second epitaxial layer has a second peak concentration of the first dopant species, and the second peak concentration is 50 percent or less of the first peak concentration.

14. A device comprising:
- a first nanostructure over a substrate
- a first inner spacer in contact with the first nanostructure; and
- a first source/drain region in contact with the first nanostructure, the first source/drain region comprising:
  - a first epitaxial layer covering a first sidewall of the first nanostructure and a first portion of a sidewall of the first inner spacer, wherein the first epitaxial layer has a round convex profile opposite the first sidewall of the first nanostructure in a cross-sectional view;
  - a second epitaxial layer covering the round convex profile of the first epitaxial layer and being in physical contact with a second portion of the sidewall of the first inner spacer, wherein the first epitaxial layer comprises a first dopant with a first concentration and the second epitaxial layer comprises the first dopant with a second concentration different from the first concentration; and
- a third epitaxial layer on the second epitaxial layer, the third epitaxial layer having a convex top surface in the cross-sectional view, the third epitaxial layer having a third concentration of the first dopant, the third concentration being greater than the first concentration and less than the second concentration.

15. The device of claim 14, wherein the first epitaxial layer has a first thickness measured at a midpoint of the first nanostructure, wherein the first epitaxial layer has a second thickness measured at a point level with a bottom surface of the first nanostructure, and wherein a ratio of the second thickness to the first thickness is in a range from 0.7 to 1.0.

16. The device of claim 14 wherein the first dopant is phosphorus, and wherein the second concentration is greater than the first concentration.

17. The device of claim 14 wherein the first dopant is arsenic, and wherein the second concentration is less than the first concentration.

18. The device of claim 17, wherein the first epitaxial layer comprises a second dopant with a fourth concentration and the second epitaxial layer comprises the second dopant with a fifth concentration, wherein the second dopant is phosphorus, and wherein the fifth concentration is greater than the fourth concentration.

19. The device of claim 1, wherein the first epitaxial layer has a first peak concentration of the first dopant, wherein the second epitaxial layer has a second peak concentration of the first dopant, and wherein the second peak concentration is 50 percent or less of the first peak concentration.

20. The device of claim 14, wherein the first epitaxial layer has a first peak concentration of the first dopant, wherein the second epitaxial layer has a second peak concentration of the first dopant, and wherein the second peak concentration is 50 percent or less of the first peak concentration.

* * * * *